US011870349B2

(12) United States Patent
Langeslag et al.

(10) Patent No.: US 11,870,349 B2
(45) Date of Patent: Jan. 9, 2024

(54) INPUT VOLTAGE RIPPLE COMPENSATION OF INTERLEAVED BOOST CONVERTER USING CYCLE TIMES

(71) Applicant: NXP USA, Inc., Austin, TX (US)

(72) Inventors: Wilhelmus Hinderikus Maria Langeslag, Wijchen (NL); Remco Twelkemeijer, Wijchen (NL)

(73) Assignee: NXP USA, Inc., Austin, TX (US)

( * ) Notice: Subject to any disclaimer, the term of this patent is extended or adjusted under 35 U.S.C. 154(b) by 94 days.

(21) Appl. No.: 17/412,223

(22) Filed: Aug. 25, 2021

(65) Prior Publication Data
US 2023/0069460 A1 Mar. 2, 2023

(51) Int. Cl.
*H02M 3/158* (2006.01)
*H02M 1/00* (2006.01)
(Continued)

(52) U.S. Cl.
CPC ........ *H02M 3/1586* (2021.05); *G01R 29/023* (2013.01); *H02M 1/0043* (2021.05); *H02M 1/14* (2013.01); *H02M 1/4216* (2013.01)

(58) Field of Classification Search
CPC ............ H02M 3/00; H02M 3/02; H02M 3/04; H02M 3/10; H02M 3/135; H02M 3/137; H02M 3/139; H02M 3/142; H02M 3/155; H02M 3/1552; H02M 3/156; H02M 3/1566; H02M 3/157; H02M 3/158; H02M 3/1584; H02M 3/1586; H02M 3/1588; H02M 3/33515; H02M 1/0003; H02M 1/0009;
(Continued)

(56) References Cited
U.S. PATENT DOCUMENTS 11,444,540 B1  9/2022  Langeslag et al.
11,557,960 B1  1/2023  Twelkemeijer et al.
(Continued)

FOREIGN PATENT DOCUMENTS

CN         101753014 B         1/2012
WO    WO-2020205167 A1      10/2020

OTHER PUBLICATIONS

L. Huber et al., "Closed-Loop Control Methods for Interleaved DCM/CCM Boundary Boost PFC Converters", IEEE, 2009, pp. 991-997. (Year: 2009).*

(Continued)

*Primary Examiner* — Thienvu V Tran
*Assistant Examiner* — Carlos O Rivera-Perez

(57) ABSTRACT

A method and apparatus are described for compensating input voltage ripples of an interleaved boost converter using cycle times. In an embodiment, a phase compensator receives a first duty cycle measurement of a first converter and a second duty cycle measurement of a second converter, compares the first duty cycle to the second duty cycle and generates a phase compensation in response thereto. A phase combiner combines a phase adjustment output and the phase compensation and produces a phase control output, and a cycle controller is coupled to the first and the second converters to generate a first drive signal to control switching of the first converter and to generate a second drive signal to control switching of the second converter, wherein a time of the second drive signal is adjusted using the phase control output.

20 Claims, 13 Drawing Sheets

(51) Int. Cl.
*G01R 29/02* (2006.01)
*H02M 1/14* (2006.01)
*H02M 1/42* (2007.01)

(58) Field of Classification Search
CPC .............. H02M 1/0016; H02M 1/0022; H02M 1/0025; H02M 1/0032; H02M 1/0035; H02M 1/0043; H02M 1/0067; H02M 1/12; H02M 1/14; H02M 1/143; H02M 1/146; H02M 1/15; H02M 1/42; H02M 1/4216; H02M 1/4225; H02M 1/44; G01R 29/00; G01R 29/02; G01R 29/023; Y02B 70/10
USPC .... 363/65, 74, 123, 124; 323/212–219, 235, 323/271–275, 277, 280, 282–285, 351
See application file for complete search history.

(56) References Cited

U.S. PATENT DOCUMENTS

| | | | |
|---|---|---|---|
| 2007/0253223 A1* | 11/2007 | Neidorff | H02M 1/4225 363/2 |
| 2012/0218792 A1 | 8/2012 | Ziegler et al. | |
| 2014/0152271 A1 | 6/2014 | Jeong et al. | |
| 2015/0146467 A1 | 5/2015 | Seong et al. | |
| 2016/0276924 A1 | 9/2016 | Castelli | |
| 2022/0103078 A1 | 3/2022 | Fan et al. | |
| 2022/0158545 A1 | 5/2022 | Tan | |

OTHER PUBLICATIONS

Park, Moo-Hyun et al. "ZVS Interleaved Totem-pole Bridgeless PFC Converter with Phase-shifting Control", The 2018 International Power Electronics Conference, (2018), 5 pgs.

Aditya, Kunwar et al. "Design of 3.3 kW Wireless Battery Charger for Electric Vehicle Application Considering Bifurcation", 2017 IEEE Electrical Power and Energy Conference (EPEC), (2017), 6 pgs.

Chang, Chien-Hsuan et al. "An Interleaved Single-Stage LLC Resonant Converter Used for Multi-Channel LED Driving", The 2014 International Power Electronics Conference, (2014), 8 pgs.

Choi, Woo-Young et al.; "An Efficient Power-Factor Correction Scheme for Plasma Display Panels"; Journal of Display Technology; vol. 4, No. 1; Mar. 2008; pp. 70-80.

Liu, Zhengyang et al.; "Design and Evaluation of GaN-Based Dual-Phase Interleaved MHz Critical Mode PFC Converter"; 2014 IEEE Energy Conversion Congress and Exposition; Nov. 2014; pp. 611-616.

Adragna, C. et al.; "Analysis and Performance Evaluation of Interleaved DCM/CCM Boundary Boost PFC Converters Around Zero-Crossing of Line Voltage"; Applied Power Electronics Conference and Exposition; APEC 2009; Twenty-Fourth Annual IEEE, Piscataway, NJ, USA; Feb. 15, 2009; pp. 1151-1157.

U.S. Appl. No. 17/364,756, filed Jun. 30, 2021 (44 pages).

Bento, Aluisio A. M. et al. "Reducing Inductor Size and Current Ripple in an AC-AC Converter by Interleaved Switching Strategy", Downloaded on Apr. 24, 2021 from IEEE Xplore, (2006), 7 pgs.

Cao, Guoen et al. "A Novel Critical-Conduction-Mode Bridgeless Interleaved Boost PFC Rectifier", The 2014 International Power Electronics Conference, (2014), 6 pgs.

Tomioka, Satoshi et al. "Interleaved-Boost-Input Type Isolated Full Bridge PFC Converter", IEEE PEDS 2005, Downloaded on Apr. 24, 2021 from IEEE Xplore, 6 pgs.

Balestero, Juan Paulo Robles et al. "Power Factor Correction Boost Converter Based on the Three-State Switching Cell", IEEE Transactions on Industrial Electronics, vol. 59, No. 3, Mar. 2012, 13 pgs.

U.S. Appl. No. 17/364,756 Ex Parte Quayle dated Aug. 17, 2023 (22 pages).

U.S. Appl. No. 17/364,756 Notice of Allowance dated Sep. 27, 2023 (10 pages).

* cited by examiner

INPUT VOLTAGE RIPPLE COMPENSATION OF INTERLEAVED BOOST CONVERTER USING CYCLE TIMES

BACKGROUND

Electric power conversion is widely used in varied applications including adjustable-speed electric motor drives, switch-mode power supplies, uninterrupted power supplies (UPSs), and battery energy storage. In high-power applications, two boost converters are often interleaved to improve the performance and reduce the size of converter. For high-current applications and voltage step-up, the currents through the solid-state switches are just fractions of the input current. Interleaving also doubles the effective switching frequency and allows the size of energy-storage inductors and electro-magnetic interference (EMI) filter components to be reduced. This also reduces input and output ripples in the current. The switches are used to time the power phase of each converter. Typically, the two converters alternate in operation so that their power cycles are 180 degrees out of phase.

Power Factor Correction (PFC) converters are used for improved power quality and improved efficiency. Passive PFC may be performed using tuned LC filters, but these may have a limited frequency and power range. Active PFC uses actively controlled solid-state switches in association with passive elements. The switches allow the PFC converter to operate in different modes. A PFC boost converter boosts the input voltage for a higher output voltage.

SUMMARY

A method and apparatus are described for compensating input voltage ripple for an interleaved boost converter using cycle times. In an embodiments, a boost converter control system includes a phase compensator to receive a first duty cycle measurement of a first converter of an interleaved boost converter and a second duty cycle measurement of a second converter of the interleaved boost converter, to compare the first duty cycle measurement to the second duty cycle measurement and to generate a phase compensation in response to the comparison. A phase combiner is configured to combine a phase adjustment output and the phase compensation to produce a phase control output. A cycle controller is coupled to the first and the second converters to generate a first drive signal to control switching of the first converter and to generate a second drive signal to control switching of the second converter, wherein a time of the second drive signal is adjusted using the phase control output.

In some embodiments, the comparison comprises a ratio of a difference between the first duty cycle measurement and the second duty cycle measurement and a sum of the first duty cycle measurement and the second duty cycle measurement. In some embodiments, a time of the first drive signal is also adjusted using the phase control output. In some embodiments, the first duty cycle measurement and the second duty cycle measurement are made during a same switching cycle of the interleaved boost converter.

In some embodiments, the first converter has a first power phase with a first primary stroke during which a first gate of the first converter is enabled and the first duty cycle measurement comprises a comparison of a duration of the first primary stroke and a duration of the first power phase. The second converter has a second power phase with a second primary stroke during which a second gate of the second converter is enabled and the second duty cycle measurement comprises a comparison of a duration of the second primary stroke and a duration of the second power phase.

In some embodiments, the first converter has a first ringing phase after the first power phase before a next power phase. The second converter has a second ringing phase after the second power phase before a next power phase. The phase compensator receives a first ringing phase duration and a second ringing phase duration, and the phase compensator generates the phase compensation further in response to a difference between the first ringing phase duration and the second ringing phase duration.

In some embodiments, the first duty cycle measurement comprises a measurement of a time duration that ends when an inductor current of the first converter goes to zero. In some embodiments, the first duty cycle measurement comprises a measurement of a time duration that ends when an inductor auxiliary winding voltage of the first converter goes to zero.

In some embodiments, the first duty cycle measurement comprises a measurement of a time duration that ends when a voltage of a drain coupled to the first gate goes to input voltage. In some embodiments, the first duty cycle measurement comprises a measurement of a time duration that ends when an inductor auxiliary winding voltage of the first converter reaches a local minimum. In some embodiments, the phase control output is to drive the phase of the second converter to 180 degrees with respect to the first converter.

Some embodiments further include a differential ON time generation circuit to generate a first ON time for the first converter and a second ON time for the second converter and to adjust the second ON time based on the phase compensation, wherein the cycle controller is coupled to the differential ON time generation circuit to receive the first and the second ON time to control switching of the first and the second converters. In some embodiments, the differential ON time generation circuit is further to receive an ON time and wherein the first ON time is generated using the received ON time.

Some embodiments further include a phase detector to receive a first phase feedback signal of the first converter and a second phase feedback signal of the second converter, to measure the phase difference between the first phase feedback signal and the second phase feedback signal and to produce a phase detection output indicating the measurement, a phase controller coupled to the phase detector to receive the phase detection output and to generate a phase adjustment output in response to the phase detection output, and a phase combiner to combine the phase detection output and the phase compensation to produce the phase control output, wherein the phase combiner is coupled to the cycle controller.

In another embodiment an interleaved boost converter includes a first converter having a first gate and operating at a first phase to receive an input voltage and generate a first converter output power, a second converter having a second gate and operating at a second phase to receive an input voltage and generate a second converter output power, a phase detector to receive a first phase feedback signal of the first converter and a second phase feedback signal of the second converter, to measure the phase difference between the first phase feedback signal and the second phase feedback signal and to produce a phase detection output indicating the measurement, a phase controller coupled to the phase detector to receive the phase detection output and to generate a phase adjustment output in response to the phase detection output, a phase compensator to receive a first duty cycle measurement of the first converter and a second duty cycle measurement of the second converter, to compare the first duty cycle measurement to the second duty cycle measurement and to generate a phase compensation in response to the comparison, a phase combiner to combine the phase adjustment output and the phase compensation to produce a phase control output, a differential ON time generation circuit coupled to the phase combiner to generate a first ON time for the first converter and a second ON time for the second converter and to adjust the second ON time based on the phase control output, and a cycle controller coupled to the first and the second converters and to the differential ON time generation circuit to receive the first and the second ON time and to generate a first drive signal to control switching of the first converter and to generate a second drive signal to control switching of the second converter in response to the first and the second ON time.

In another embodiment, a method includes receiving a first duty cycle measurement of a first converter of an interleaved boost converter, receiving a second duty cycle measurement of a second converter of the interleaved boost converter, comparing the first duty cycle measurement to the second duty cycle measurement, generating a phase compensation in response to the comparison, combining a phase adjustment output and the phase compensation to produce a phase control output, and generating a first drive signal to control switching of the first converter, adjusting a time of a second drive signal using the phase control output, and generating the second drive signal to control switching of the second converter.

DETAILED DESCRIPTION

Figure 1:
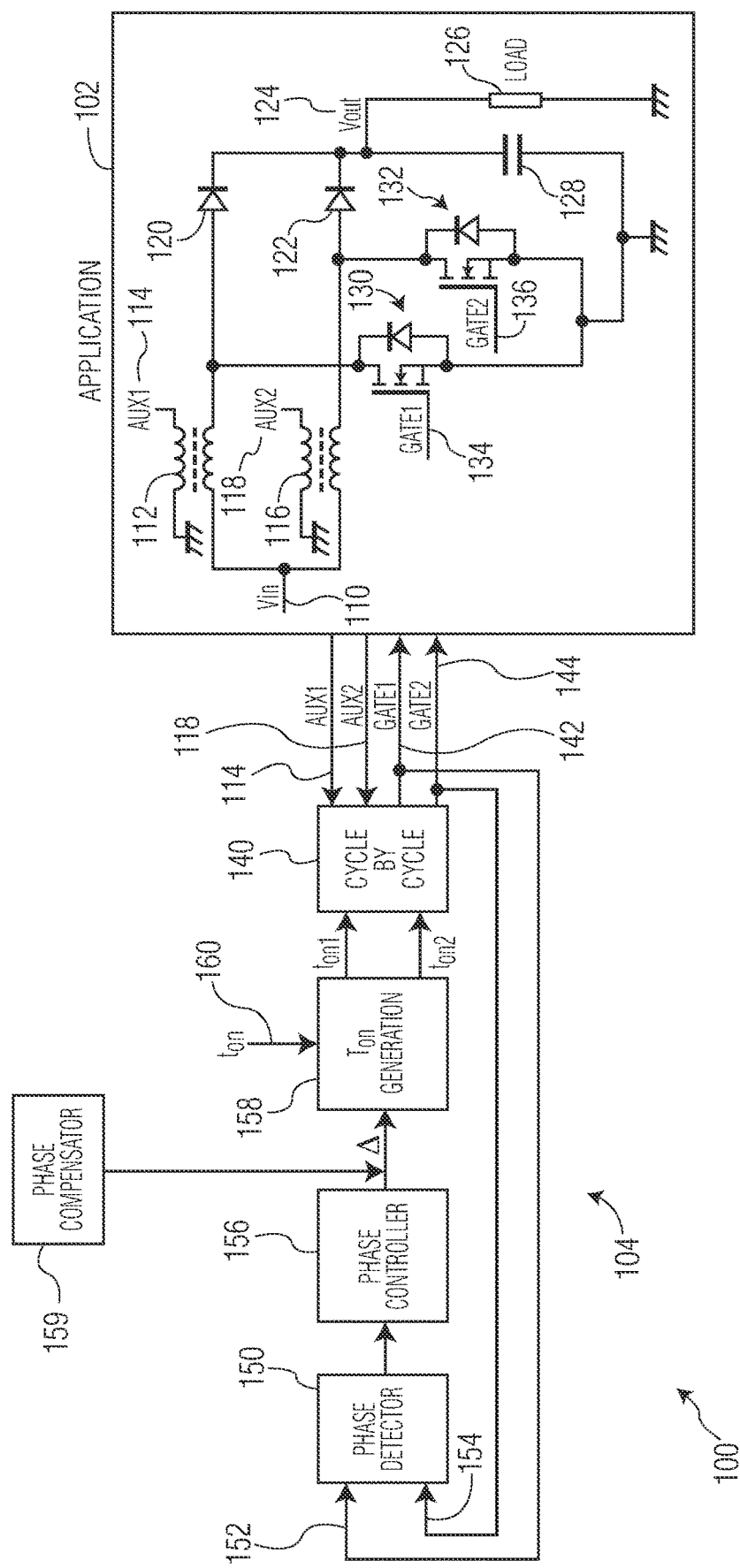
FIG. 1 is a diagram of a DC-DC interleaved boost converter.

It will be readily understood that the components of the embodiments as generally described herein and illustrated in the appended drawings could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

An interleaved PFC boost converter has two discrete converters that can be controlled independently. The two converters are switched on and off independently so that the ON time of each converter is regulated separately. By controlling the ON times, the phase between the two converters can be maintained close to 180 degrees so that the power output is interleaved. As described herein, the ON time has two dimensions. The first is the duration that a converter is drawing power from the input. In a simple single MOSFET (Metal Oxide Semiconductor Field Effect Transistor) switch converter circuit, this ON time is the time during which the switch or MOSFET gate is ON. The second dimension is the time at which the gate is switched ON. This is directly related to the phase or period of the converter switch.

FIG. 1 is a diagram of a Direct Current to Direct Current (DC-DC) interleaved boost converter 100 with an application 102 and a control system 104. The application 102 receives a DC input voltage 110 which is divided into two interleaved converters. The first converter receives the DC input voltage 110 at a first inductor 112 in series with a first diode 120 coupled to the converter output 124. A drain of a switch 130 in the form of a MOSFET (Metal Oxide Semiconductor Field Effect Transistor) is coupled between the first inductor 112 and the first diode 120. While a MOSFET is shown, other transistor types, such as bipolar transistors and other materials may be used such as GaN or SiC, among others, to suit different loads and input voltages. The source of the switch is coupled to ground. The second converter receives the DC input voltage 110 at a second inductor 116 in series with the DC input voltage 110 on one side of the inductor and in series with a second diode 122 on the other side of the inductor. The output nodes of the two diodes are coupled together at the converter output 124 opposite the inductors 112, 116. A drain of a second switch 132 in the form of a second MOSFET is coupled between the second inductor 116 and the second diode 122. The source of the first switch 130 and of the second switch 132 are both coupled to ground. The second converter has the same converter output 124 coupled to the outputs of the two diodes 120, 122. The first converter output and the second converter output are connected together to form an interleaved power output from the two interleaved converters. The converter output 124 has a filter 128 in the form of a parallel capacitor but a more complex filter may be used to suit different loads and input voltages. A load 126 is coupled to the converter output 124 and shown here as within the application. The load may be any type of energy storage or energy consumption device.

While the switch of a converter is ON, a power phase starts with a primary stroke as power is drawn from the input and stored in the inductor. Then during a secondary stroke of the power phase power is drawn from the input and delivered to the output. Also, the energy stored in the inductor is delivered to the output. When the current becomes zero, a ringing phase starts.

The two converters are controlled by the boost converter control system 104 that includes a phase detector 150, a phase controller 156, a differential ON time generation circuit 158, a cycle-by-cycle controller 140, and a phase compensator 159, among other components (not shown). The two switches 130, 132 are controlled by a cycle-by-cycle controller 140 that generates respective first and second drive signals 142, 144. The cycle-by-cycle controller 140, also referred to as the cycle controller, adjusts the first and second drive signals 142, 144 such that phase can be adjusted and the total power is regulated. The current through the respective two diodes 120, 122 therefore is interleaved and shifted in time.

A 180 degree phase difference means that the second converter turns on at a time that is exactly half-way between two consecutive turn-on times of the first converter. Under some circumstances, the power from the two converters to the output alternates. At low input voltages each converter may be turned on for more than half of its switching cycle. As a result, the power phases of the converters overlap. At high input voltage, the diode conducting time may be more than half of the converter's switching cycle. In this case, both diodes are conducting at the same time, although one of the diodes may be at a higher current because of the phase difference of the converters.

A differential ON time generation circuit 158 receives an ON time input 160 from an external controller (not shown) and a phase control output from the phase controller 156 and the phase compensator 159. This information is used to generate a respective first ON time and a second ON time that is provided to the cycle-by-cycle controller to control the duration during which the first and the second converters are switched ON. The differential ON time generation circuit receives the phase control output and generates the first and the second ON time in response to adjust the phase between the first and the second phase feedback signals toward 180 degrees. In some embodiments, the ON time input 160 is a current or a voltage. The current or voltage may be increased for a longer ON time or reduced for a shorter ON time. The ON time may be a numerical value that represents a number of milliseconds or microseconds. In some embodiments, the phase difference is a numerical value which represents the difference in phase between the first and the second converter in milliseconds or microseconds.

The differential ON time generation circuit may generate the first ON time using the phase control output because increasing the ON time of one converter compared to the other converter will change the relative phase between the converters.

The phase controller 156 receives a phase signal from a phase detector 150 and generates a phase adjustment output in response to the phase signal indicating a phase measurement. In some embodiments, the phase controller is a proportional controller. The phase detector receives a phase feedback signal 152 which is connected to the first drive signal 142 coupled to the first gate 134 from the first converter and a phase feedback signal 154 which is connected to the second drive signal 144 coupled to the second gate 136 from the second converter. The phase feedback or gate signals are compared to measure the phase difference between the two phase feedback signals at the phase detector 150 and the resulting phase signal is a phase detection output indicating the measurement that is provided to the phase controller 156. In some embodiments, when the phase difference is 180 degrees, the phase signal is 0.

The voltages on the auxiliary windings of the first inductor 112 and the second inductor 116 may be taken as feedback signals that are labeled as AUX 1 114 and AUX 2 118. The AUX 1 and AUX 2 signals are provided to the cycle-by-cycle controller to determine a start time for the first and second drive signals 142, 144. Alternatively, the drain voltage of the first switch 130 and the second switch 132 or the current through the first and second inductors 112, 116 may be used to define a start time for the first and second drive signals. Any other suitable signal may be measured that indicates the power output of the respective converter with respect to time. The AUX/Drain/Current signals are used by the cycle-by-cycle controller to determine when to turn on the first switch and the second switch using drive signals as described in more detail below.

While the phase control loop, including the phase detector 150 and phase controller 156, regulate the phase difference between the two gates 134, 136, in some operational modes, ripples in the input voltage can cause the input voltage to differ between the two inverters. A phase compensator 159 is added to compensate for this difference. The phase compensator 159 receives feedback from the converters to determine input voltages or duty cycle times. Using this information, the phase compensator generates a phase compensation that is applied to the output of the phase controller 156 to generate a phase control output.

Figure 2:
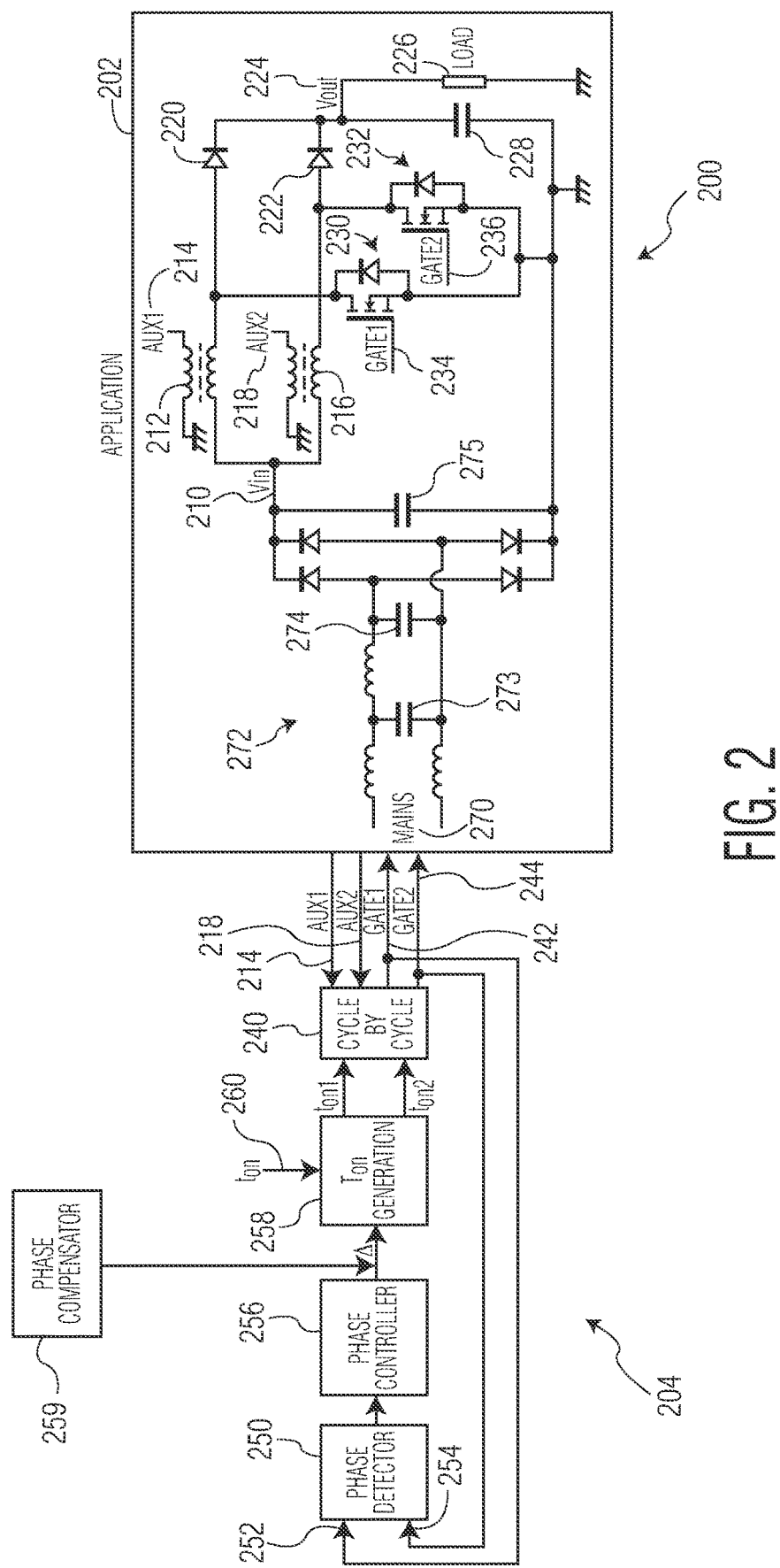
FIG. 2 is a diagram of an AC-DC interleaved boost converter.

FIG. 2 is a diagram of an Alternating Current to Direct Current (AC-DC) interleaved boost converter 200 with an application 202 and a control system 204. The application has a diode bridge rectifier 272 that receives an alternating current (AC) input 270, for example a mains voltage and generates a DC output. The mains voltage typically alternates at 50 or 60 Hz or some other value in the range of tens of Hertz. This output is the rectified input voltage 210 to the interleaved boost converter section. The rectifier includes two filter capacitors 273, 274 at the voltage input before the rectifier and a filter capacitor 275 after the rectifier before the converters. The particular configuration of the filter circuit and rectifier circuit may be modified to suit different implementations. A similar circuit may also be used in the DC input configuration of FIG. 1.

Smaller filter capacitors, i.e., capacitors with a lower capacitance, provide a higher power factor and a faster response time to get a lower total harmonic distortion (THD). However, the faster response time reduces the amount of filtering and can cause larger ripples in the input voltages to the two converters. The ripples can cause a variation in the input voltages between the two converters that make it difficult to interleave the converters and achieve a 180 degree phase difference between the two inverters.

The boost converters are the same as in FIG. 1 and use a first switch 230 and a second switch 232, for example MOSFET transistor switches, to interleave the rectified input voltage 210 from the rectifier 272 to the output 224 at a common node to power the load 226. The first converter receives the rectified input voltage 210 at a first inductor 212 that is coupled to the drain of the first switch 230 and to a first series output diode 220. The second converter receives the rectified input voltage 210 at a second inductor 216 that is coupled to the drain of the second switch 232 and to a second series output diode 222. The sources of the two transistor switches 230, 232 are coupled to ground. A load 226 is coupled to the output 224 and shown here as within the application. The output is filtered by a parallel grounded capacitor 228.

Phase feedback signals are measured from the first drive signal 242 and the second drive signal 244 from the cycle-by-cycle controller and applied as phase feedback signals 252, 254 to a phase detector 250. As mentioned above, the phase may be measured at any of a variety of different points on each converter. The phase detector 250 measures the phase difference between the two converters using the phase feedback signals 252, 254. In some embodiments, the phase feedback signals are combined to produce a phase difference voltage to a phase controller 256. If the two converters are completely out of phase, then the output will be zero. In some embodiments, the phase feedback signals are used to produce an output that is a numerical representation of the phase difference. The phase controller uses the phase detector output and generates a phase adjustment output. This may be performed using an analog amplifier or in the digital domain. The phase adjustment output, Δ, depending on operational conditions, may be modified by a phase adjustment from a phase compensator 259. The modification may be before or after the phase controller 256 or at another system node. The modified phase adjustment output is a phase control output that is applied to a differential ON time generation circuit 258 that combines the phase difference with an external $t_{on}$ value to generate time duration output signals, $t_{on1}$, $t_{on2}$, to drive a cycle-by-cycle controller 240, also referred to as a cycle controller, and adjust the phase between the first and the second phase feedback signals toward 180 degrees.

As in the example of FIG. 1, the cycle-by-cycle controller 240 controls the two transistor switches 230, 232 with the respective first drive signal 242 and the second drive signal 244 applied to the gates 234, 236 of the switches. The cycle-by-cycle controller 240 adjusts the first drive signal 242 and the second drive signal 244 using the time duration output signals and the input AUX 1 214 and AUX 2 218 signals that, in this example, are measured at the auxiliary windings of the first inductor 212 and the second inductor 216, respectively to interleave the power phase of the two converters onto the output 224. The control loops and the interleaved converter sections of the configurations of FIG. 1 and FIG. 2 are shown as identical, but either or both may be modified to suit different applications.

While the phase control loop, including the phase detector 250 and phase controller 256, regulate the phase difference between the two gates 234, 236, in some operational modes, ripples in the input voltage can cause the input voltage to differ between the two inverters. A phase compensator 259 is added to compensate for this difference. The phase compensator 259 receives feedback from the converters to determine input voltages or duty cycle times. Using this information, the phase compensator generates a phase compensation that is applied to the output of the phase controller 256 to generate a phase control output.

Figure 3:
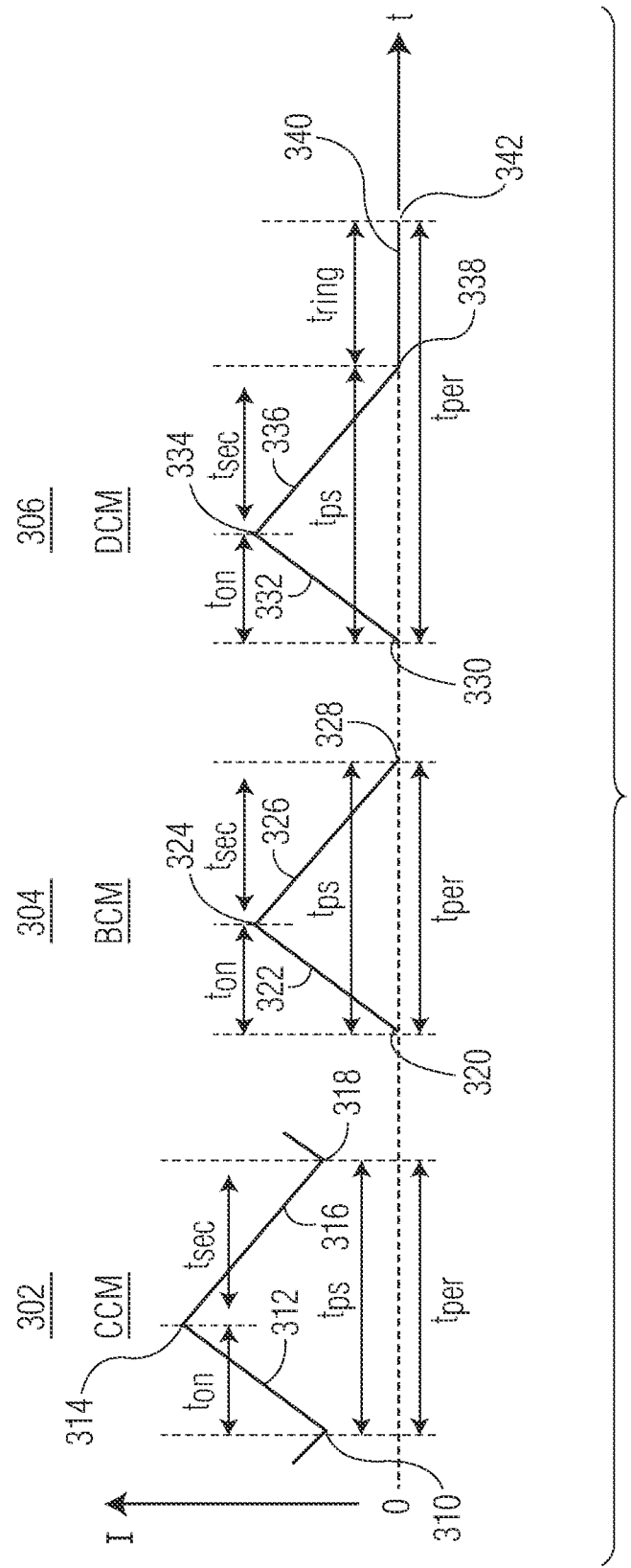
FIG. 3 is a graph of three different operational modes of an interleaved boost converter.

FIG. 3 is a graph of three different operational modes of an interleaved converter, for example the ones of FIG. 1 and FIG. 2 and variations thereof. The graph shows inductor current of one of the converters on the vertical axis against time on the horizontal axis. The solid-state switches of an interleaved PFC boost converter allow the converter to be operated in different modes. For medium and high-power applications, a CCM (Continuous Conduction Mode) is common. The CCM has a continuous input current which results in low conducted electromagnetic interference (EMI).

The first mode 302 represents CCM in which the inductor current never reaches zero and so the converter is conducting continuously. At the start of a power phase 310, the inductor current has reached its lowest point and the cycle-by-cycle controller turns the gate of the converter switch to ON. The inductor current increases through a primary stroke 312 reaching a peak at a point 314 corresponding to the transition to a secondary stroke. The duration of the primary stroke is the switch ON time indicated as $t_{on}$. After the switch is turned off the current declines through the secondary stroke 316 until the end of the period of the power cycle as defined by the primary stroke and the secondary stroke. The end of the second stroke 318 corresponds to the beginning of the next period and the start of the next primary stroke. The period of operation corresponds to frequency on the order of KHz as compared to the tens of Hertz of an input AC voltage.

If the entire period is viewed as 360 degrees by analogy to sine waves, 180 degrees is exactly the middle. If the two converters are interleaved so that the primary stroke of the second converter starts at the midpoint of the period of the second converter and the point 314 is exactly in the middle, then the input current of the interleaved converter will be approximately a constant current. As the first converter inductor current is decreasing, the second converter inductor current is increasing. The position of the peak at the point 314 is dependent on input voltage and output voltage of the converter. At low mains voltages, the peak is closer to the end and at high mains voltages, the peak is closer to the beginning. The output voltage is controlled to a value, the ripple voltage, caused by switching, for example may be further reduced with additional filtering as appropriate.

The second mode 304 is commonly referred to as BCM (Boundary Conduction Mode) or sometimes as CrCM (Critical Conduction Mode). In this mode, the primary and secondary stroke are very similar except that the gate of the converter switch is only turned ON when the inductor current reaches zero. The initial zero crossing 320 is the beginning of the primary stroke 322 of the ON time in the BCM 304. At the peak current time 324 the transition is made and the switch is set to OFF. The inductor current decreases during the secondary stroke 326 until a zero crossing 328. The period in BCM may be increased by increasing the ON time and thereby increasing the primary stroke. The secondary stroke will accordingly become longer as well. Increasing the period also increases the inductor current as the current becomes higher during the primary stroke. The described control loop of FIG. 1 may be used to change the ON time of a primary or master converter to increase or decrease the inductor current and the period. The secondary or slave converter may be matched to that period time or ON duration by adjusting the ON time of both converters, e.g., increasing the $t_{on}$ of one converter while decreasing the $t_{on}$ of the other converter. The timing may be adjusted through the phase detector and phase controller until the entire period is aligned to be out of phase with the first converter. In some embodiments, the phase between the two interleaved converters is aligned by adjusting only the duration of the switch ON time of both converters. This does not necessarily require adjustments to a ringing phase of the converters.

The third mode 306 is commonly referred to as DCM (Discontinuous Conduction Mode) because the inductor current (=input current) has a dead period where no power is delivered. There is an added delay after the secondary stroke before the next primary stroke. In the DCM 306, the first stroke begins at a zero inductor current crossing time 330 with the switch turned ON. The primary stroke 332 extends through a current rise time and a peak inductor current 334 at which the switch ON time is ended and the inductor current falls during the second stroke 336 to a zero inductor current crossing 338. Instead of starting the next period at the end of this power phase, the switch remains off for an additional time 340 during a ringing phase. The end of the ringing phase is the end of the period 342 at which time the next power phase begins with another primary stroke 332 by turning the switch to ON with a drive signal from the cycle-by-cycle converter.

The power phase may be considered as the time during which power is drawn from the input node. The ringing phase is a time during which the inductor current is ringing around zero current due to the inductor value and the and capacitance of the physical circuit. The drain voltage of the MOSFET switch rings around the input voltage in this phase. If the amplitude of the drain voltage ringing is below the threshold of the output diode, then no power will reach the output node during the ringing phase.

Many interleaved power factor correction (PFC) converter control systems currently support only BCM to make the phase equal to 180 degrees. With an interleaved PFC converter operating in DCM with valley switching, the 180 degree phase difference can be lost at lower switching frequencies due to the influence of the capacitors in the filter circuits on the phase control loop. This can occur in BCM and DCM but may be worse in DCM for which the switching frequencies may be lower. The phase compensator is able to maintain the phase difference even when the switching frequencies are low and the filter capacitors are small.

Figure 4:
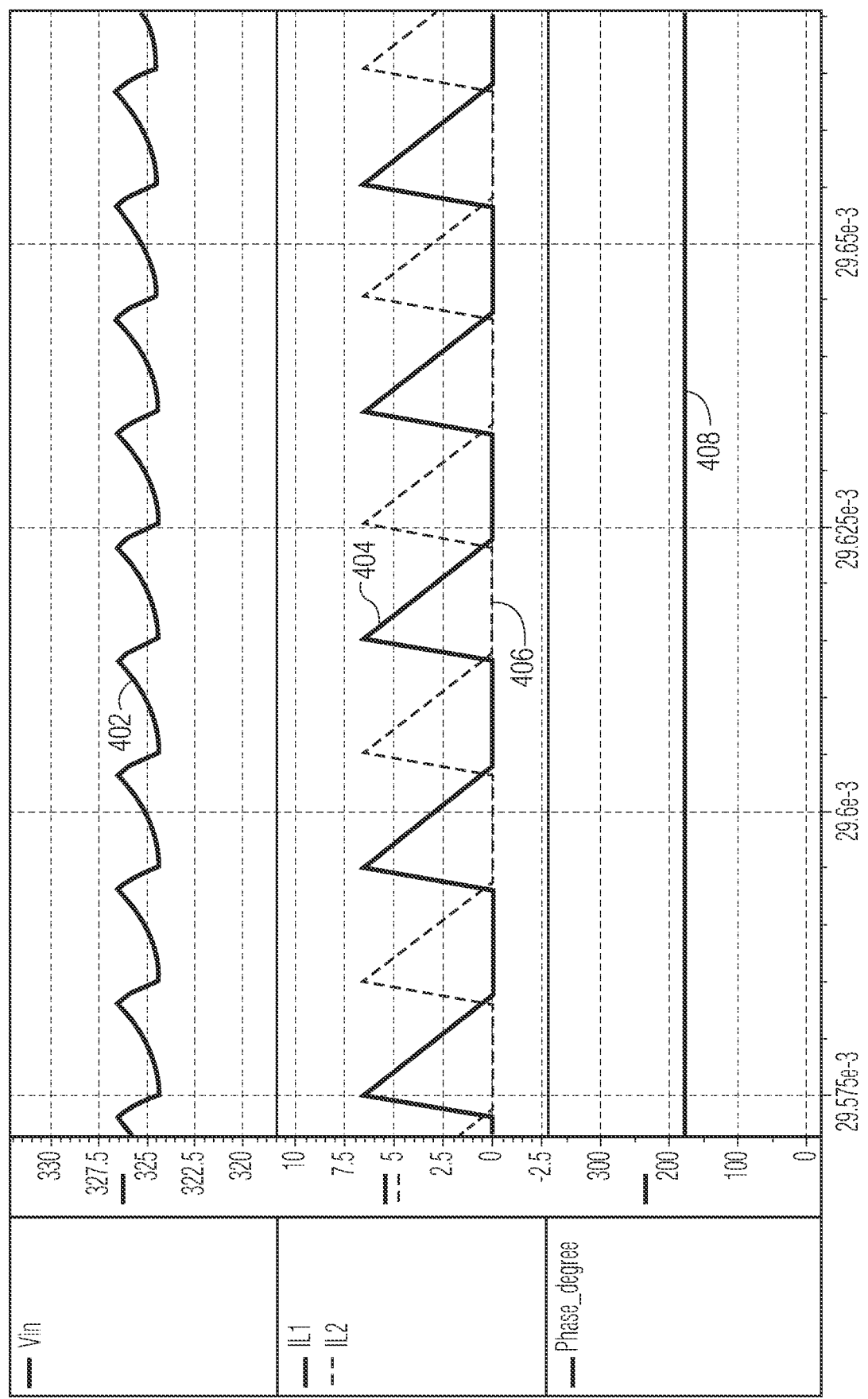
FIG. 4 is a graph for an interleaved boost converter with large input capacitors.

FIG. 4 is a graph for an interleaved boost converter with large input capacitors with time on the horizontal axis using a phase loop control system similar to that described above, but without the phase compensation provided by a phase compensator 159, 259. The first curve 402 is the input voltage. One central curve 404 is the inductor current of the first converter and the other central curve 406 is the inductor current of the second converter. The bottom curve 408 is a straight line and indicates the phase in degrees. As shown, the input voltage 402 and the inductance curves 404, 406 are the same for both phases. The phase difference 408 is nicely regulated to 180 degrees.

Figure 5:
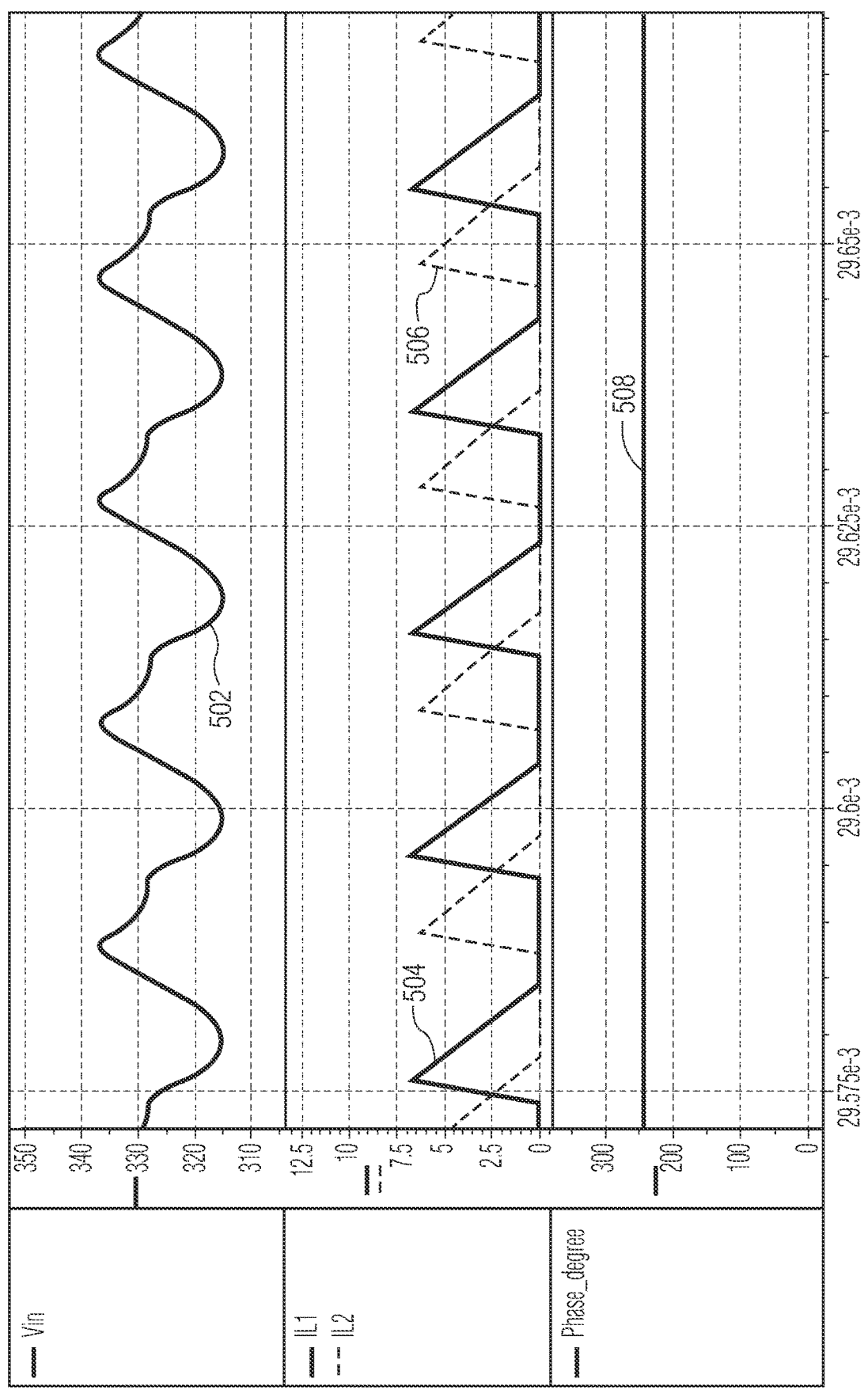
FIG. 5 is a graph for an interleaved boost converter with relatively much smaller input capacitors.

FIG. 5 is a graph for an interleaved boost converter with relatively much smaller input capacitors with time on the horizontal axis using a phase loop control system similar to that described above, but without the phase compensation provided by a phase compensator 159, 259. The first curve 502 is the input voltage. One central curve 504 is the inductor current of the first converter and the other central curve 506 is the inductor current of the second converter. The bottom curve 508 is a straight line and indicates the phase in degrees. As shown, the input voltage 502 is different for the two phases. The inductance curves 504, 506 are not aligned. The phase difference 508 is not regulated to 180 degrees. The phase control system operates in a mode in which the phase is not 180 degrees, because the input voltage of each phase of the interleaved PFC is different.

Figure 6:
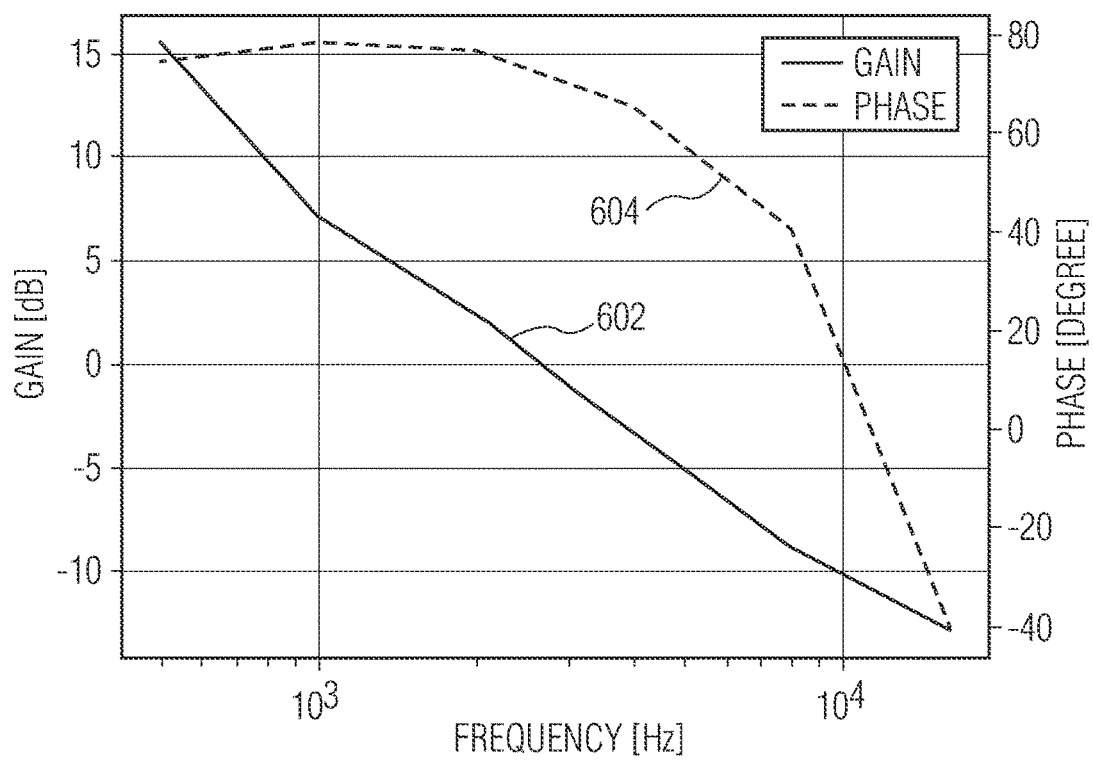
FIG. 6 is a Bode plot of a gain phase simulation of the interleaved boost converter with large input capacitors.

FIG. 6 is a Bode plot in the frequency domain of a gain phase simulation of the interleaved boost converter with large input capacitors as described above. Gain and phase are indicated on the vertical axis and frequency on the horizontal axis for the large capacitor configuration as in FIG. 4. The lower curve 602 shows gain and the upper curve 604 shows the related phase. Both curves show a regular progression of increasing gain and phase as the frequency diminishes. The phase levels off and gradually declines starting at about $10^3$ Hz.

Figure 7:
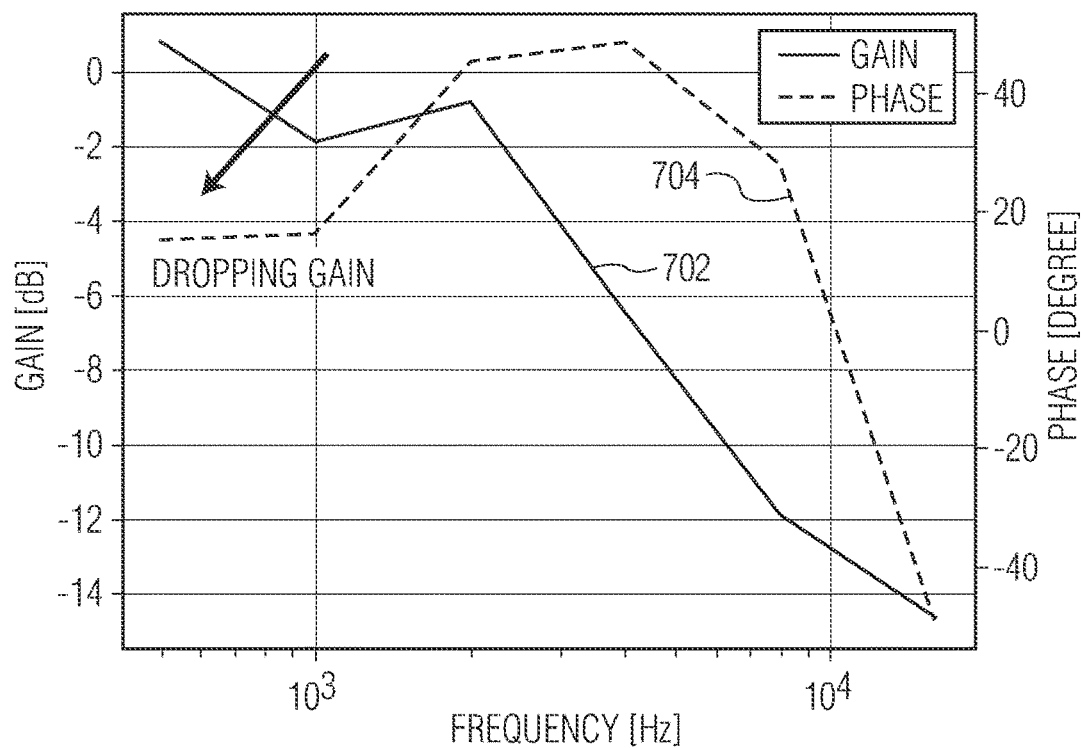
FIG. 7 is a Bode plot of a gain phase simulation of the interleaved boost converter with relatively much smaller input capacitors.

FIG. 7 is a Bode plot of a gain phase simulation of the interleaved boost converter with relatively much smaller input capacitors as described above. Gain and phase are indicated on the vertical axis and frequency on the horizontal axis for the small capacitor configuration as in FIG. 5. The lower curve 702 shows gain and the upper curve 704 shows the related phase. With the small input capacitors of the mains filter, the gain and the phase both drop at low frequencies. This results in a low gain margin and a low phase margin.

As described below, the phase control loop may be operated to compensate for the effect of the relatively smaller capacitors in the mains filter. A phase compensator 159, 259 in the phase control loop as shown in FIG. 1 and FIG. 2 takes measurements at different times during the switching cycle of the inverter and then adjusts the phase based thereon.

The frequency ω of a boost converter can be written in different ways as shown in Equation 1:

$$\omega = \frac{2\pi}{t_{period}} = \frac{2\pi}{t_{on} + t_{sec} + t_{ring}} = \frac{2\pi}{\frac{U_o}{U_o - U_i} \cdot t_{on} + t_{ring}} \quad \text{(Eq. 1)}$$

In Equation 1, $t_{on}$ describes the operation of the ON time generation circuit and the two inverters are switched on with a duration time $t_{on1}$ and $t_{on2}$, respectively. The relationship between these two ON times is provided in Equations 2 and 3 in which Δ is a control parameter of the phase loop:

$$t_{on1} = t_{on} \cdot (1+\Delta) \quad \text{(Eq. 2)}$$

$$t_{on2} = t_{on} \cdot (1-\Delta) \quad \text{(Eq. 3)}$$

The input voltage Vin of converter 1 may or may not be the same as the input voltage of converter 2. This is shown in FIG. 5. The frequency $\omega_1$ of converter 1 may be as defined in Equation 4 and the frequency $\omega_2$ of converter 2 may be as defined in Equation 5.

$$\omega_1 = \frac{2\pi}{f \frac{U_o}{U_o - U_{i1}} \cdot t_{on} \cdot (1 + \Delta) + t_{ring1}} \quad \text{(Eq. 4)}$$

$$\omega_2 = \frac{2\pi}{f \frac{U_o}{U_o - U_{i2}} \cdot t_{on} \cdot (1 - \Delta) + t_{ring2}} \quad \text{(Eq. 5)}$$

wherein:
$t_{on}$: The input of the ON time generation circuit
$t_{ring1}$: The ringing time of converter 1
$t_{ring2}$: The ringing time of converter 2
$\Delta$: The control parameter of the phase loop
$U_o$: The output voltage of the converters (assumed to be constant for both converters during a single switching cycle)
$U_{i1}$: The input voltage of converter 1
$U_{i2}$: The input voltage of converter 2

A regulated phase converter is configured to operate the frequency of converter 1 and converter 2 to the same value and to regulate the phase between converter 1 and converter 2 to 180° or $\pi$. This may be expressed by equating Equations 4 and 5 in accordance with:

$$\omega_1 = \omega_2 \quad \text{(Eq. 6)}$$

Some of the parameters of Equations 4 and 5 can be expressed as time durations $\delta$ instead of as voltages. The time durations are more suitable in a phase control loop than voltage measurements. In many power factor corrector boost converter configurations, the high frequency ripple of the input voltage is not usually measured. For the CCM of FIG. 3, the voltages may be replaced with time durations in the form of duty cycles as in Equations 7 and 8. This parameter may be used in BCM mode and in DCM as well. The subscript CCM refers to duty cycles in CCM.

$$\frac{U_o}{U_o - U_{i1}} = \frac{1}{\delta_{ccm1}} \quad \text{(Eq. 7)}$$

$$\frac{U_o}{U_o - U_{i2}} = \frac{1}{\delta_{ccm2}} \quad \text{(Eq. 8)}$$

Using these duty cycle values $\delta$, equations 4, 5, 6, 7, and 8 may be combined as shown in Equation 9. The duty cycles are defined in Equations 10, 11, and 12.

$$\Delta = \frac{\delta_{ccm1} - \delta_{ccm2} - \frac{\Delta t_{ring}}{t_{on}} \cdot \delta_{ccm1} \cdot \delta_{ccm2}}{\delta_{ccm1} + \delta_{ccm2}} \quad \text{(Eq. 9)}$$

$$\delta_{ccm1} = \frac{t_{on\_act1}}{t_{ps1}} \quad \text{(Eq. 10)}$$

$$\delta_{ccm2} = \frac{t_{on\_act2}}{t_{ps2}} \quad \text{(Eq. 11)}$$

$$\Delta t_{ring} = t_{ring1} - t_{ring2} \quad \text{(Eq. 12)}$$

wherein:
$t_{on\_act1}$: The $t_{on1}$ at the falling edge of gate1
$t_{on\_act2}$: The $t_{on2}$ at the falling edge of gate2
$t_{ps}$: The time of the primary and the secondary strokes By neglecting the difference in ringing time, which is often small, Equation 9 can be simplified to Equation 13 which compares the first duty cycle measurement and the second duty cycle measurement to obtain a phase compensation.

$$\Delta = \frac{\delta_{ccm1} - \delta_{ccm2}}{\delta_{ccm1} + \delta_{ccm2}} \quad \text{(Eq. 13)}$$

In Equation 10, for the calculation of the first duty cycle $\delta_{ccm1}$, the $t_{on1}$ at the falling edge of gate1 is needed: $t_{on\_act1}$. In equation 11, for the calculation of the second duty cycle $\delta_{ccm2}$, the $t_{on2}$ at the falling edge of gate2 is needed: $t_{on\_act2}$. These parameters are shown in the example of FIG. 8.

Figure 8:
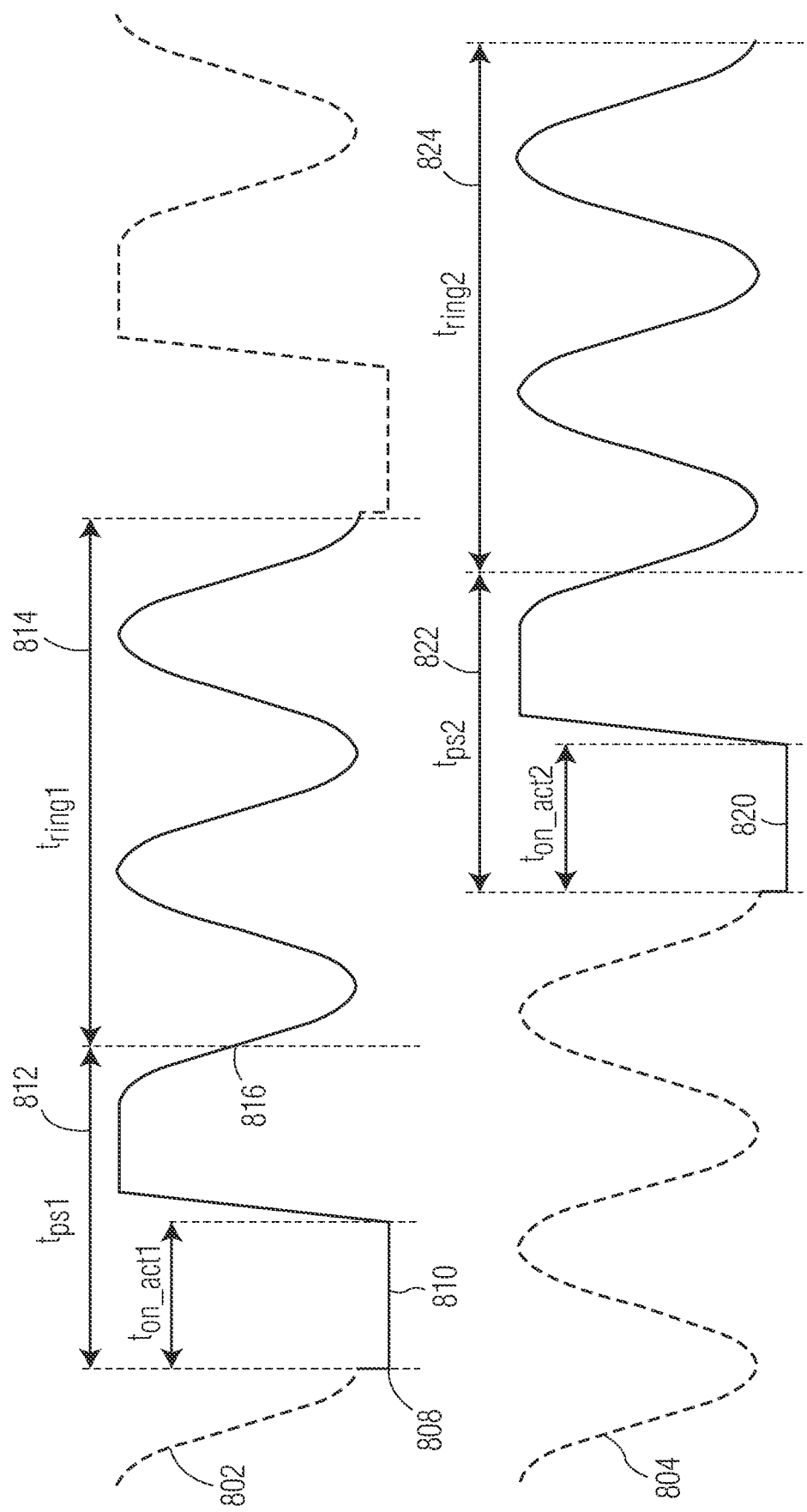
FIG. 8 is a graph of voltage measured at two converters of an interleaved converter.

FIG. 8 is a graph of the voltage measured at the two converters of the interleaved converter. The voltage may be measured at different locations or the inductor current may be measured to obtain a related result. At 802, the drain voltage of a switch of converter 1 is graphed on the vertical axis against time on the horizontal axis. At 804, the drain voltage of a switch of converter 2 is graphed on the vertical axis against time on the horizontal axis. At time 808 a power phase 810 for converter 1 begins with the gate enabled or ON. This instant may be used as the start time for the $t_{ps1}$ 812 measurement although other times may be used instead. The gate is enabled for a time determined as $t_{on\_act1}$ 810 and then it is disabled. The drain voltage immediately rises. The end of the power phase and of the $t_{ps1}$ period is also the start of the ringing phase $t_{ring1}$ 814 in DCM. The end of $t_{ps1}$ may be measured in different ways. The inflection point 816 of the voltage is a good end time for the power phase. Another suitable event is when the drain voltage begins to fall or when the drain voltage is at a local minimum, also referred to as a valley for valley switching.

For the second converter voltage 804 the same times are shown with a different alignment with respect to the first converter voltage 802. A power phase 820 for converter 2 begins with the gate enabled or ON. This instant is used as the start time for the $t_{ps2}$ 822 measurement. The gate is enabled for a time determined as $t_{on\_act2}$ 820 and then it is disabled. The drain voltage immediately rises. The end of the power phase and of the $t_{ps2}$ period is also the start of the ringing phase $t_{ring2}$ 824 in DCM. The end of $t_{ps2}$ is the voltage inflection point after the voltage starts to fall.

Similar measurements may be made with the voltage of the auxiliary winding of the inductor of a converter instead of the drain. The shape of the curve is substantially the same as for the drain voltage only the average value of the drain voltage is Vin and the average value of the AUX voltage is 0.

The ends of the ringing phases 814, 824 mark the beginning of the next power phase. The interval from the start or rising edge of the first power stroke at 808 and the rising edge of the next power stroke is one complete switching cycle of converter 1. The gate is enabled for the duration of the ON time which begins and drives the primary stroke. At the end of the ON time, the gate is disabled and the drain voltage reduces until the start of the next ringing phase. In DCM, the duration of the ON time is regulated to control the output of the converter and the duration of the ringing phase.

The result $\Delta$ in equations 9 and 13 may be determined for each switching cycle when converter 2 ends its switching cycle. At this time all of the parameters can be determined. Accuracy is improved when all of the time related parameters of converter 1 are from the same switching cycle and all of the time related parameters of converter 2 are also from the same switching cycle. In some embodiments, $\Delta$ is determined at the rising edge of gate 2. The use of this determination of $\Delta$ in the phase control loop reduces the problems caused by using the relatively smaller capacitors as shown in the results below.

Figure 9:
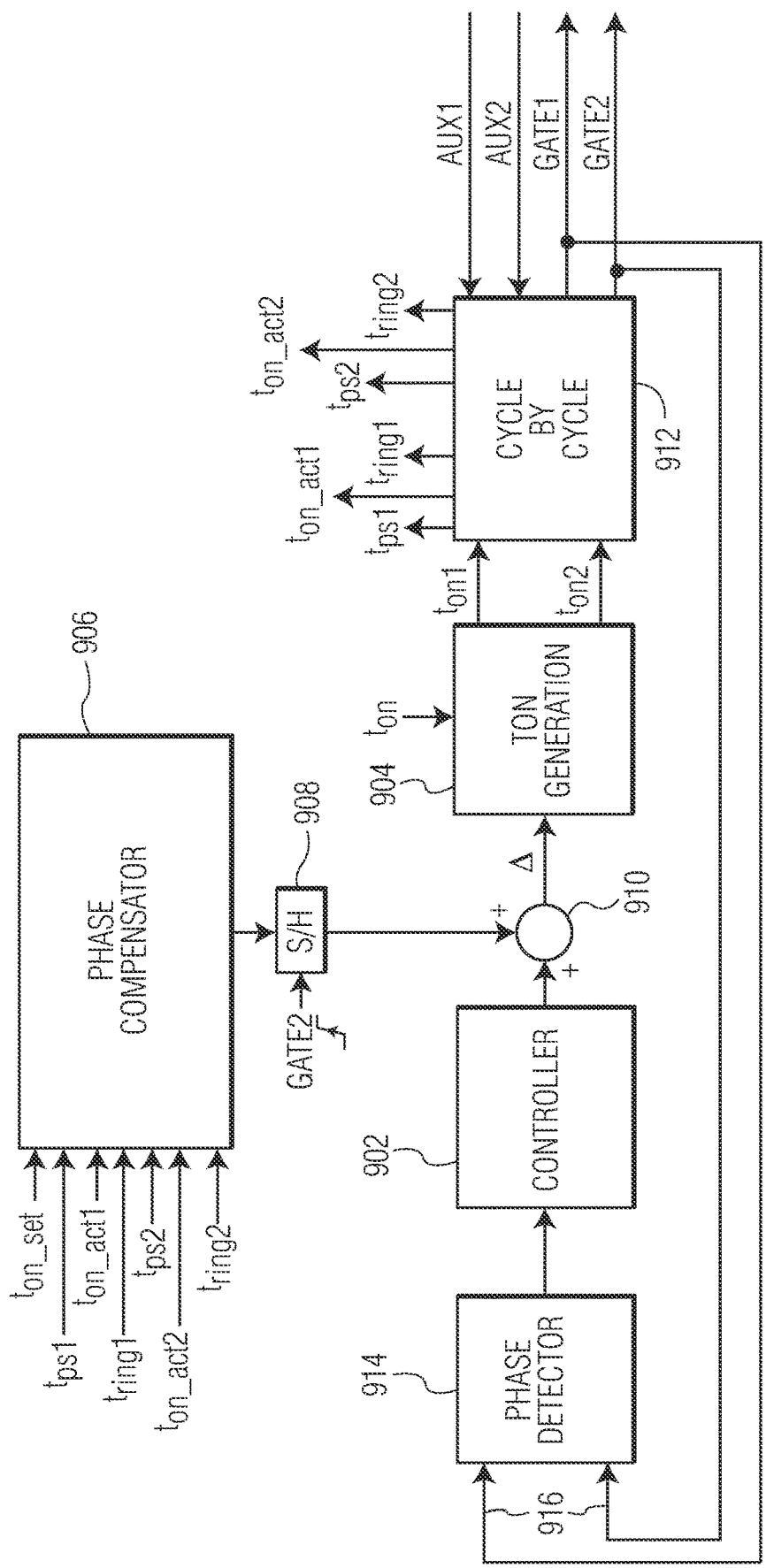
FIG. 9 is a block diagram of a portion of a phase control loop using a phase compensator.

FIG. 9 is a block diagram of a portion of a phase control loop using a phase compensator. The phase compensator may be used in the place of the phase compensators shown above (e.g., 159, 259). The phase control loop incudes a phase controller 902 which receives a phase difference from a phase detector 914 that is generated based on phase feedback signals 916 from the converters. The phase controller 902 uses the phase difference and generates a phase adjustment output, Δ, which is modified by a phase compensator 906 through a phase combiner 910 in the form of a mixer, adder, multiplier or other device. The output adjusted phase adjustment output is provided to a cycle-by-cycle controller 912 through a differential ON time generation circuit 904. The differential ON time generation circuit 904 combines the phase adjustment output with an external $t_{on}$ value to generate time duration output signals, $t_{on1}$, $t_{on2}$, to drive the cycle controller, and adjust the phase between the first and the second phase feedback signals toward 180 degrees. In some embodiments, the differential ON time generation circuit uses Equations 2 and 3 to generate the time duration output signals.

The phase compensator 906 generates a value using Equation 9 which is applied to a sample and hold circuit 908. The resulting value is applied to the phase combiner 910 to be combined with the phase adjustment output from the phase controller. To perform the operations of Equation 9, the phase compensator receives the needed values from the cycle-by-cycle controller 912 and the ON time $t_{on}$ which is also provided or sent to the differential ON time generation circuit 904 as in input from the common external source. As shown, values available from the cycle-by-cycle controller 912 include $t_{ps1}$, $t_{on\_act1}$, $t_{ring1}$, $t_{ps2}$, $t_{on\_act2}$, and $t_{ring2}$. These values are all generated by the cycle-by-cycle controller or received from the converters as feedback signals such as the signals indicated as AUX1 and AUX2.

In some embodiments, $t_{on\_set}$ is used instead of $t_{on}$ as the input to the phase compensator. When $t_{on}$ is changing very slow then $t_{on}=t_{on\_set}$. This is the case when $t_{on}$ is directly generated by the voltage control loop. The bandwidth of this loop is low and $t_{on}$ is effectively constant during a single switching cycle. When $t_{on}$ is changing fast then $t_{on\_set}$ is the sampled value of $t_{on}$. The moment of sampling be adapted to suit any particular implementation.

As shown, the offset to the phase adjustment output Δ from the phase compensator 906 is added to the phase compensation loop by the phase combiner 910 by a parallel path from the cycle-by-cycle controller 912 to the phase compensator 906 to the phase adjustment. The phase control loop operates independent of any action from the phase compensator 906 and the phase compensator only provides an offset when appropriate to the converter operating conditions. The phase compensator 906, through the sample and hold circuit 908 provides an offset that may be 1 for multiplicative mixer or 0 for an additive mixer. Using the phase compensator, a difference in the input voltages can be compensated independent of the phase control loop. A difference in the ringing time between the two converters may also be compensated by the parallel path and independent of the phase control loop.

The phase compensator and parallel path may be simplified using the techniques of Equation 13. This may be done using the same or different physical components. Equation 13 ignores the ring times $t_{ring1}$, $t_{ring2}$ so it is more useful under operating conditions or configurations for which the ringing time is not as important. In one condition, the interleaved converters are running in BCM. In another condition the difference between the ringing times of the two converters is small. In another condition, the ringing time of the two converters is forced. In another condition, the phase controller is configured to regulate away the error caused by the difference between the ringing times of the two converters.

Figure 10:
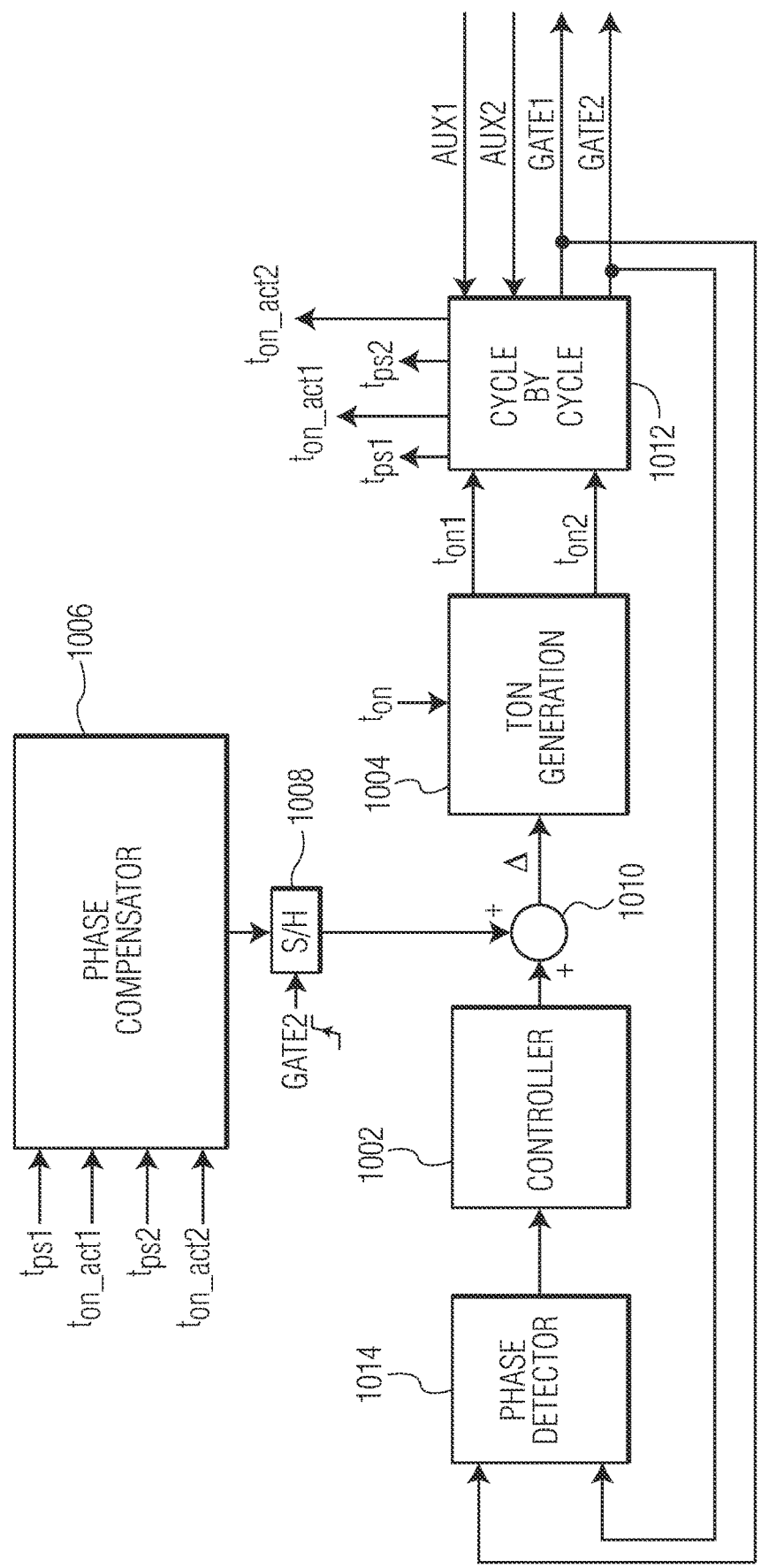
FIG. 10 is a block diagram of a portion of a phase control loop using an alternative phase compensator.

FIG. 10 is a block diagram of a portion of a phase control loop using an alternative phase compensator that implements the technique of Equation 13. The phase compensator may be used in the place of the phase compensators shown above (e.g., 159, 259). The phase control loop includes a phase controller 1002 which receives a phase difference voltage from a phase detector 1014 that is generated based on phase feedback signals 1016 from the converters. The phase controller 1002 uses the phase difference voltage and generates a phase adjustment output, Δ, which is modified by a phase compensator 1006 through a phase combiner 1010, such as a mixer or multiplier. The phase adjustment output modified by the offset in the phase combiner 1010 is provided to a cycle-by-cycle controller 1012 through a differential ON time generation circuit 1004. The differential ON time generation circuit 1004 combines the phase adjustment output with an external $t_{on}$ value to generate time duration output signals, $t_{on1}$, $t_{on2}$, to drive the cycle controller, and adjust the phase between the first and the second phase feedback signals toward 180 degrees.

The phase compensator 1006 generates a value using Equation 13 which is applied to a sample and hold circuit 1008. The resulting value is applied to the phase combiner 1010 to be combined with the phase adjustment output from the phase controller. To perform the operations of Equation 13, the phase compensator receives the needed values from the cycle-by-cycle controller 1012 and the ON time, $t_{on}$, from the differential ON time generation circuit 1004 or from the common external source. As shown, the phase compensator receives values from the cycle-by-cycle controller 1012 which include $t_{ps1}$, $t_{on\_act1}$, $t_{ps2}$, and $t_{on\_act2}$. A value for $t_{on}$ is not necessary. The phase compensator operates as a parallel loop as mentioned above and may be activated or deactivated to suit operating conditions. The phase compensator may provide offsets that represent a small or large change to the phase adjustment output.

As shown, the phase compensation is an offset to the phase adjustment output Δ from the phase compensator 1006 and is added to the phase compensation loop by the phase combiner 1010 by a parallel path from the cycle-by-cycle controller 1012 to the phase compensator 1006 to the phase adjustment. The phase control loop operates independent of any action from the phase compensator 1006 and the phase compensator only provides a phase compensation when appropriate to the converter operating conditions. The phase compensator 1006, through the sample and hold circuit 1008 provides a phase compensation that may be 1 for multiplicative mixer or 0 for an additive mixer. Using the phase compensator, a difference in the input voltages can be compensated independent of the phase control loop.

Figure 11:
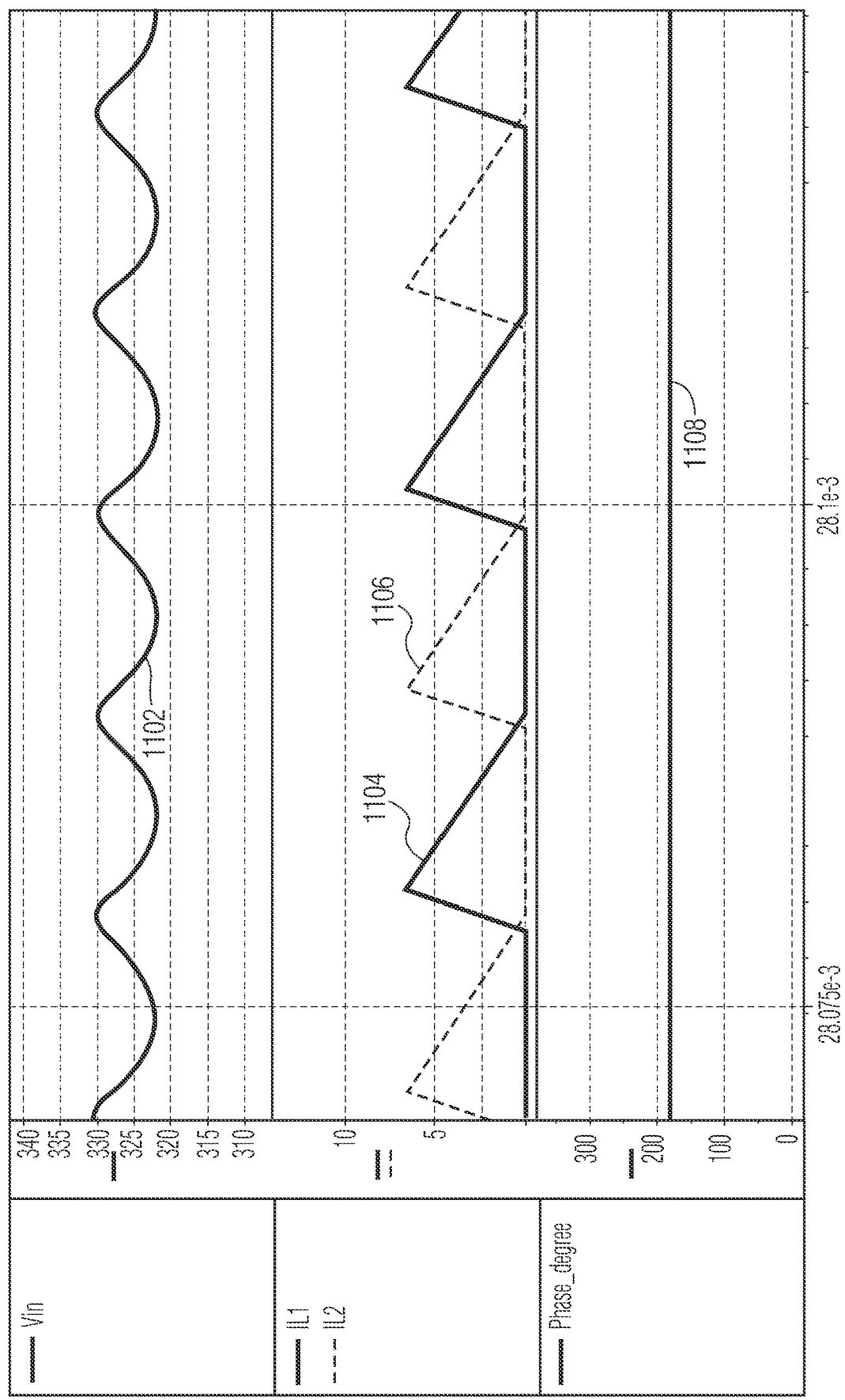
FIG. 11 is a graph for an interleaved boost converter with relatively much smaller input capacitors and a phase compensator.

FIG. 11 is a graph for an interleaved boost converter with the relatively small input capacitors of FIG. 5 with time on the horizontal axis using a phase loop control system and a phase compensator. The phase compensator 1006 is activated and provides a phase compensation to the phase adjustment output similar to that described above. The first curve 1102 is the input voltage. One central curve 1104 is the inductance of the first converter and the other central curve 1106 is the inductance of the second converter. The bottom curve 1108 is a straight line and indicates the phase in degrees. As shown, the input voltage 1102 and the inductance curves 1104, 1106 are the same for both phases. The phase difference of the bottom curve 1108 is nicely regulated to 180 degrees. The first curve 1102 shows that the input voltage has the same switching cycle for both inductor cycles shown in the central curves 1104, 1106. The irregular behavior of FIG. 5 is overcome.

Figure 12:
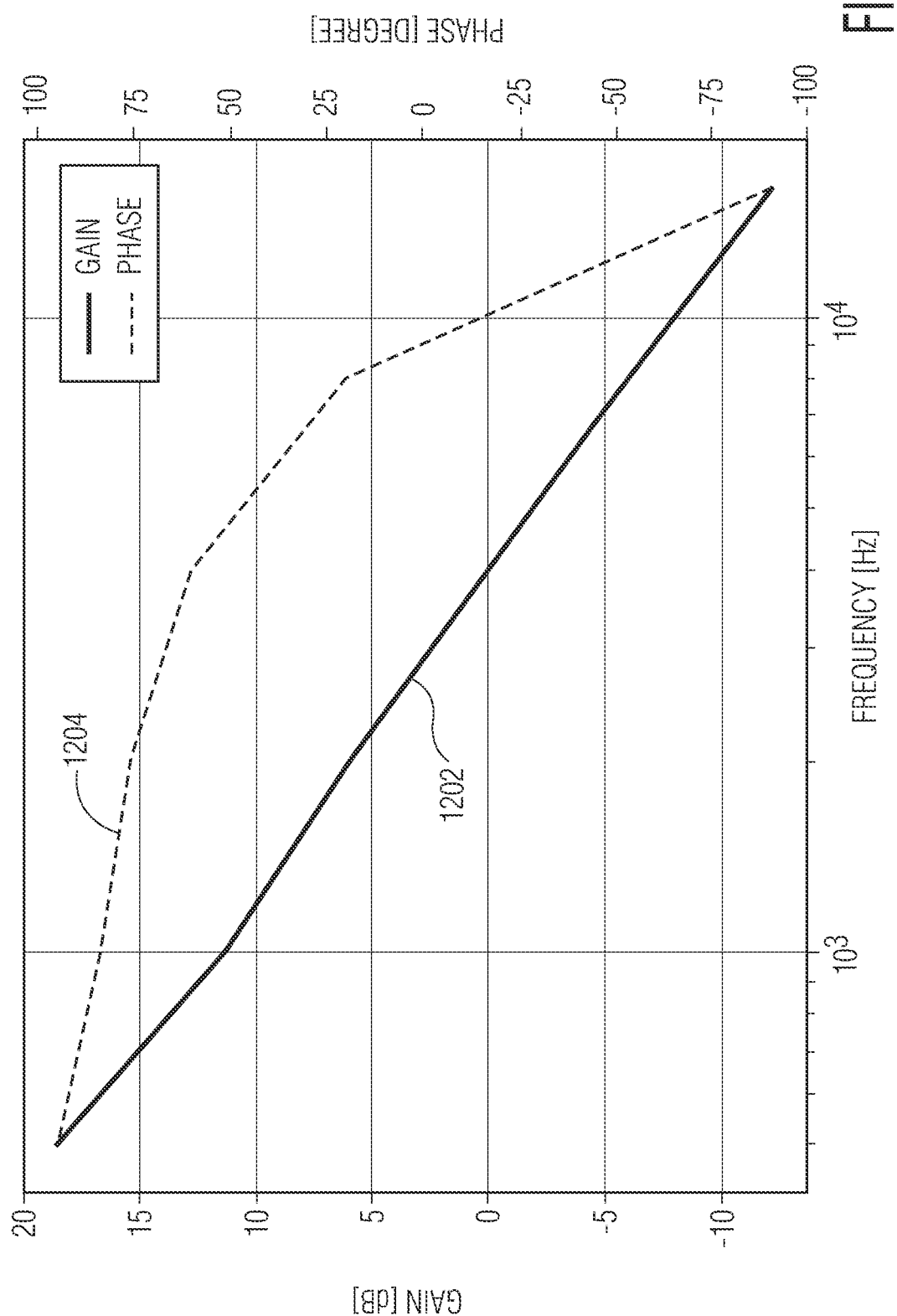
FIG. 12 is a Bode plot of a gain phase simulation of the interleaved boost converter with relatively much smaller input capacitors and a phase compensator.

FIG. 12 is a Bode plot in the frequency domain of a gain phase simulation of the interleaved boost converter with the relatively smaller input capacitors of FIG. 7 but with the phase compensation activated. The lower curve 1202 shows gain and the upper curve 1204 shows the related phase. Both curves show a regular progression of increasing gain and phase as the frequency diminishes. The phase does not level off and gradually increases for the whole range of the plot. This result is comparable to the result with the large input capacitors of the Bode plot of FIG. 6.

Figure 13:
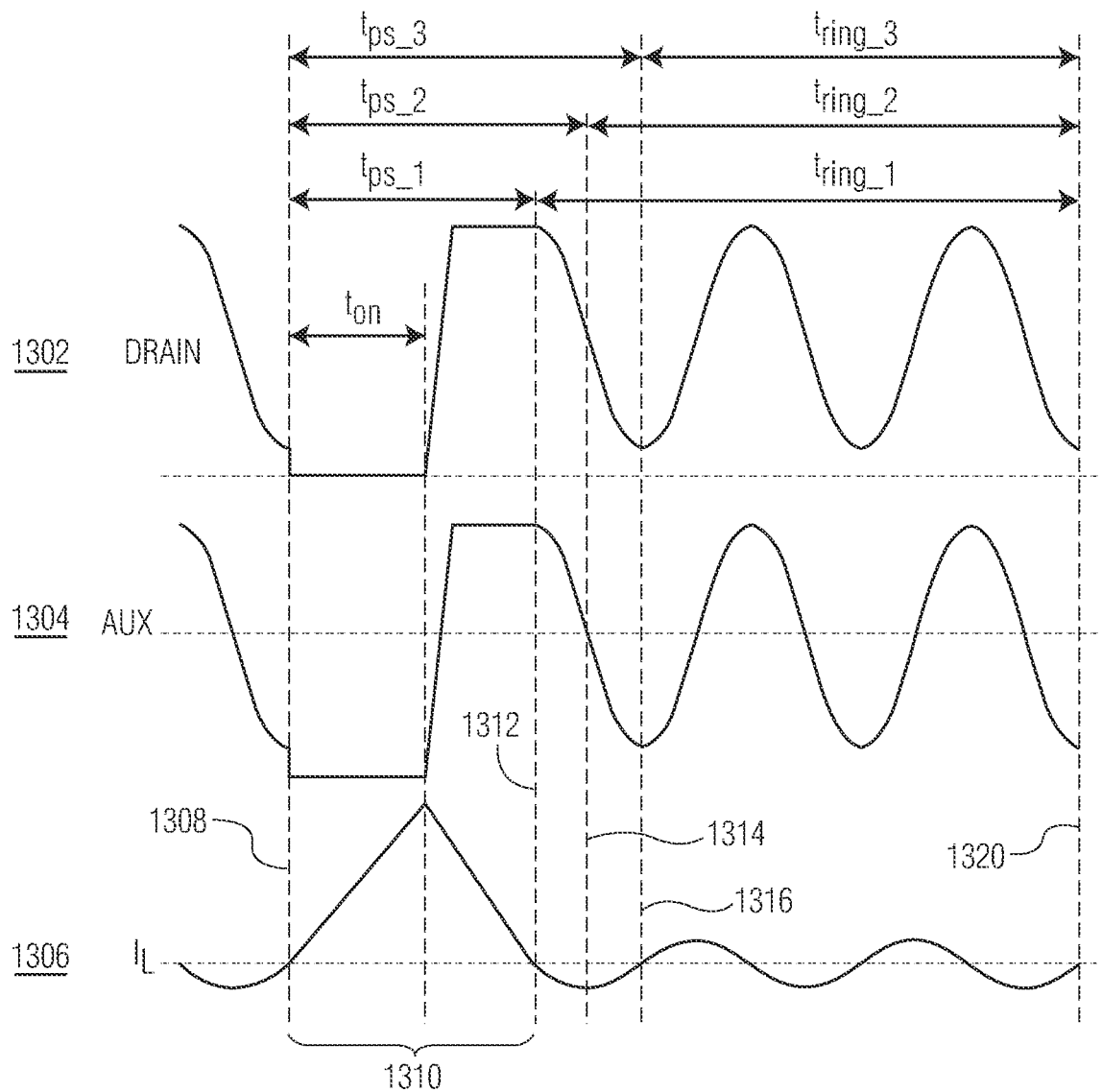
FIG. 13 is a graph of voltage for a first and a second converter measured during a power phase and a cycle time of an interleaved boost converter.

FIG. 13 is a graph of the voltage measured at two different locations and the measured inductor current to measure the $t_{ps}$ and $t_{ring}$ by different definitions. The drain voltage 1302 of a switch of a converter is graphed on the vertical axis against time on the horizontal axis. At time 1308 a power phase 1310 begins with the gate enabled or ON. This instant is used as the start time for the $t_{ps}$ measurement although other times may be used instead. The gate is enabled for a time determined as $t_{on}$ and then it is disabled. The drain voltage immediately rises. The end of the power phase and of the $t_{ps}$ period is also the start of the ringing phase $t_{ring}$ in DCM. The end may be measured in different ways. One suitable event is when the drain voltage begins to fall as shown at time 1312 and indicated as $t_{ps\_1}$. Another suitable event is when the drain voltage goes to the input voltage Vin or when the minimal ringing value (valley) as shown at time 1318 and indicated as $t_{ps\text{-}3}$.

The voltage of the auxiliary winding of the inductor of a converter is shown as AUX voltage 1304. This voltage is similar to that of the drain and the same suitable occurrences apply as with the drain voltage. The shape of the curve is the same as for the drain voltage 1302 only the average value of the drain voltage 1302 is Vin and the average value of the AUX voltage 1304 is 0. The zero crossing 1314 of the AUX voltage 1304, indicated as $t_{ps\_2}$, is a good end time for the power phase. When the of the inductor auxiliary winding voltage of the converter goes to zero, the zero crossing is easy to detect. The zero crossing is also a local minimum of the inductor auxiliary winding voltage.

The inductor current 1306 is shown on the vertical axis against time. At the time 1312 when the power phase 1310 ends, the inductor current 1306 has a zero crossing. The inductor current 1306 goes to zero at this crossing. It then starts ringing and has a second zero crossing 1316 at a second later time. This time corresponds to a first valley in the ringing voltage of the drain voltage 1302 and the inductor auxiliary winding voltage, shown as the AUX voltage 1304. Any one or more of these events may be used to determine an end time for the power phase.

The end of the ringing phase 1320 marks the beginning of the next power phase. The interval from the start or rising edge of the first power stroke at time 1308 and the rising edge of the next power stroke at 1320 is one complete switching cycle of the converter. The gate is then enabled again for another switching cycle. In DCM, the duration of the ON time is regulated to control the output of the converter and the duration of the ringing phase.

Figure 14:
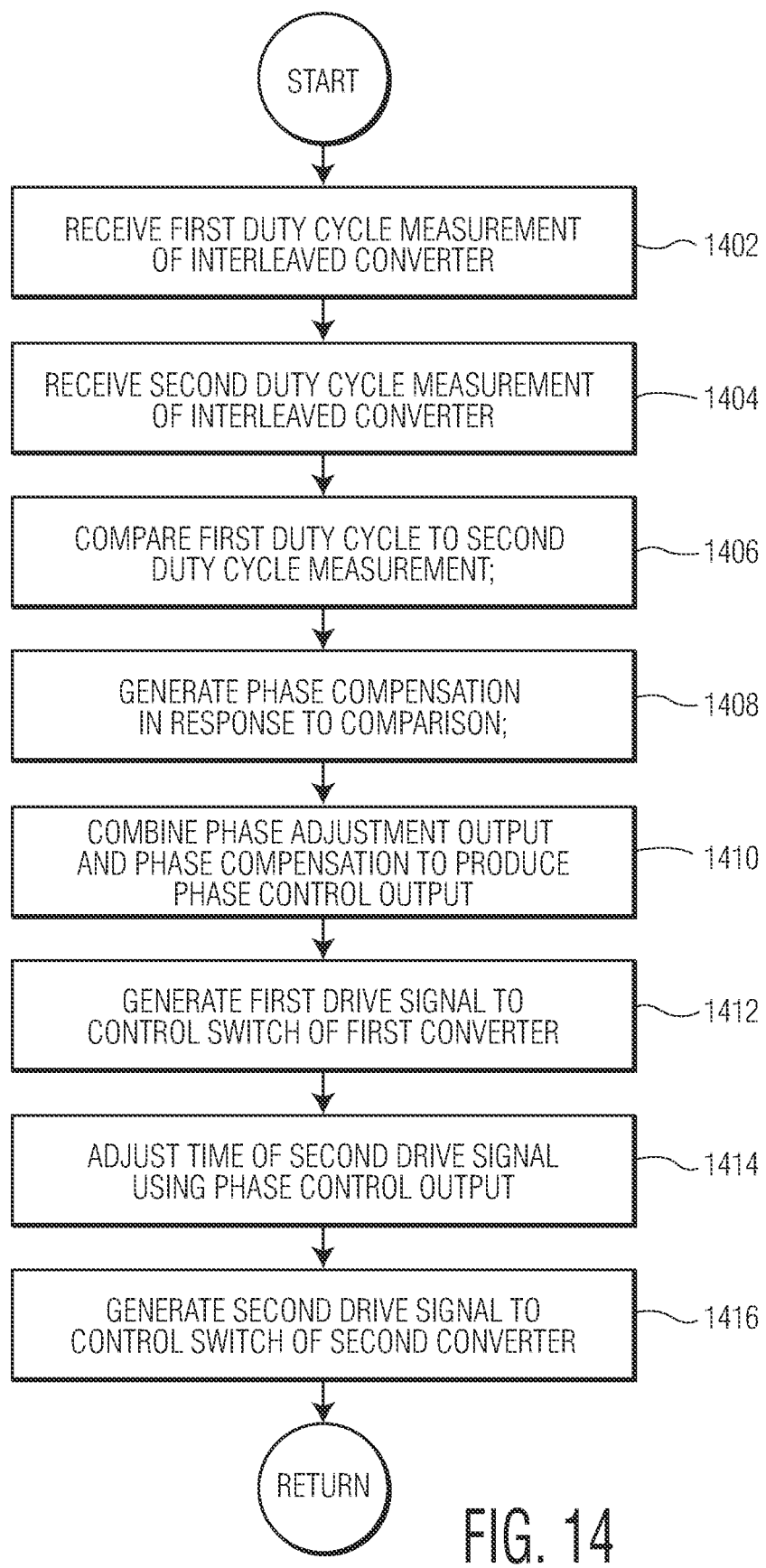
FIG. 14 is a process flow diagram of operating an interleaved boost converter.

FIG. 14 is a process flow diagram of a method of operation suitable for use with the interleaved boost converter of FIG. 1 and FIG. 2. 1402 relates to receiving first duty cycle measurement. The received first duty cycle measurement is of a first converter of an interleaved boost converter. 1404 relates to receiving a second duty cycle measurement of a second converter of the interleaved boost converter. 1406 relates to comparing the first duty cycle measurement to the second duty cycle measurement. 1408 relates to generating a phase compensation in response to the comparison.

1410 relates to combining a phase adjustment output and the phase compensation to produce a phase control output. 1412 relates to generating a first drive signal to control switching of the first converter. 1414 relates to adjusting a time of a second drive signal using the phase control output and 1416 relates to generating the second drive signal to control switching of the second converter.

The process returns to make a new adjustment of the time of the second drive signal with a new switching cycle of the interleaved converter. The duty cycles as discussed above may be measured as a comparison of the duration of the first primary stroke of the converter to the duration of the power phase of the converter. The primary stroke is a time of the power phase during which the gate of the converter is enabled. A variety of other duty cycle measurements may be used instead.

As described above, an interleaved power factor correction converter contains a phase loop to regulate the phase difference between converters toward 180°. A phase compensator operates cycle-by-cycle to compensate for the input voltage difference. The differences may be measured directly via a direct voltage measurement or indirectly via time measurements on a switching cycle. For the time measurements, duty cycle measurements may be used to determine a difference between the on-times of the two converters in a CCM. The duty cycles $\delta_{ccm}$ used herein may be represented as a ratio of the ON time and the power cycle time ($t_{pm\_act}/t_{ps}$) for each converter.

These measurements may be made all from the same switching cycle and the measurement of each converter may be made during the same switching cycle as the other or during a switching cycle that overlaps the switching cycle of the other. In some embodiments, the switching cycle of one converter lags behind the switching cycle of the other converter. Measurement of the duty cycles are made during each of the two switching cycles. When the lagging switching cycle is completed, then the measurements are used by the phase compensator to update the compensation.

When the PFC converter is running in DCM and the ringing times are not regulated away by the phase control loop, the ringing times may also be compensated with the phase compensator. The ringing times ($t_{ring}$) of each converter are also used to compensate for the input voltage difference.

Embodiments of the present invention provide a mechanism to control a phase between interleaved boost converters particularly suitable for operation in Boundary Conduction Mode and Discontinuous Conduction Mode when valley switching is used for the converter gates but are also suitable for other modes. The mechanism may be used in applications in which an interleaved boost converter is used only in Boundary Conduction Mode. The mechanism may be used in applications in which the interleaved boost converter is used as a power factor corrector. This mechanism may be applied to boost converters for a wide range of different applications and power capabilities for DC-DC and AC-DC applications. The mechanism may use analog or digital controller componentry.

The connections as discussed herein may be any type of connection suitable to transfer signals or power from or to the respective nodes, units, or devices, including via intermediate devices. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. The term "coupled" or similar language may include a direct physical connection or a connection through other intermediate components even when those intermediate components change the form of coupling from source to destination.

The described examples may be implemented on a single integrated circuit, for example in software in a digital signal processor (DSP) as part of a radio frequency integrated circuit (RFIC). Alternatively, the circuit and/or component examples may be implemented as any number of separate integrated circuits or separate devices interconnected with each other in a suitable manner. These examples may alternatively be implemented as soft or code representations of physical circuitry or of logical representations convertible into physical circuitry, such as in a hardware description language of any appropriate type.

Boundaries between the above-described operations are provided as examples. Multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A boost converter control system comprising:
a phase compensator to receive a first duty cycle measurement of a first converter of an interleaved boost converter and a second duty cycle measurement of a second converter of the interleaved boost converter, to compare the first duty cycle measurement to the second duty cycle measurement and to generate a phase compensation in response to the comparison;
a phase combiner to combine a phase adjustment output and the phase compensation to produce a phase control output; and
a cycle controller coupled to the first and the second converters to generate a first drive signal to control switching of the first converter and to generate a second drive signal to control switching of the second converter,
wherein a time of the second drive signal is adjusted using the phase control output; and
wherein the comparison comprises a ratio of a difference between the first duty cycle measurement and the second duty cycle measurement and a sum of the first duty cycle measurement and the second duty cycle measurement.

2. The boost converter control system of claim 1, wherein a time of the first drive signal is also adjusted using the phase control output.

3. The boost converter control system of claim 1, wherein the first duty cycle measurement and the second duty cycle measurement are made during a same switching cycle of the interleaved boost converter.

4. The boost converter control system of claim 1, wherein the first converter has a first power phase with a first primary stroke during which a first gate of the first converter is enabled and wherein the first duty cycle measurement comprises a comparison of a duration of the first primary stroke and a duration of the first power phase,
wherein the second converter has a second power phase with a second primary stroke during which a second gate of the second converter is enabled and the second duty cycle measurement comprises a comparison of a duration of the second primary stroke and a duration of the second power phase.

5. The boost converter control system of claim 4, wherein the first converter has a first ringing phase after the first power phase before a next power phase,
wherein the second converter has a second ringing phase after the second power phase before a next power phase,
wherein the phase compensator receives a first ringing phase duration and a second ringing phase duration, and
wherein the phase compensator generates the phase compensation further in response to a difference between the first ringing phase duration and the second ringing phase duration.

6. The boost converter control system of claim 1, wherein the first duty cycle measurement comprises a measurement of a time duration that ends when an inductor current of the first converter goes to zero.

7. The boost converter control system of claim 1, wherein the first duty cycle measurement comprises a measurement of a time duration that ends when an inductor auxiliary winding voltage of the first converter goes to zero.

8. The boost converter control system of claim 1, wherein the first duty cycle measurement comprises a measurement of a time duration that ends when a voltage of a drain coupled to the first gate goes to input voltage.

9. The boost converter control system of claim 1, wherein the first duty cycle measurement comprises a measurement of a time duration that ends when an inductor auxiliary winding voltage of the first converter reaches a local minimum.

10. The boost converter control system of claim 1, wherein the phase control output is to drive the phase of the second converter to 180 degrees with respect to the first converter.

11. The boost converter control system of claim 1, further comprising a differential ON time generation circuit to generate a first ON time for the first converter and a second ON time for the second converter and to adjust the second ON time based on the phase compensation, wherein the cycle controller is coupled to the differential ON time generation circuit to receive the first and the second ON time to control switching of the first and the second converters.

12. The boost converter control system of claim 11, wherein the differential ON time generation circuit is further to receive an ON time and wherein the first ON time is generated using the received ON time.

13. The boost converter control system of claim 1, further comprising: a phase detector to receive a first phase feedback signal of the first converter and a second phase feedback signal of the second converter, to measure the phase difference between the first phase feedback signal and the second phase feedback signal and to produce a phase detection output indicating the measurement; a phase controller coupled to the phase detector to receive the phase detection output and to generate the phase adjustment output in response to the phase detection output; and the phase combiner to combine the phase detection output and the phase compensation to produce the phase control output, wherein the phase combiner is coupled to the cycle controller.

14. The boost converter control system of claim 1:
wherein the first duty cycle measurement is $\delta_{ccm1}$;
wherein second duty cycle measurement is $\delta_{ccm2}$;
wherein the phase compensation and the ratio are $\Delta$; and
wherein the $\Delta = \delta_{ccm1} - \delta_{ccm2}/\delta_{ccm1} + \delta_{ccm2}$.

15. An interleaved boost converter comprising:
a first converter having a first gate and operating at a first phase to receive an input voltage and generate a first converter output power;
a second converter having a second gate and operating at a second phase to receive the input voltage and generate a second converter output power;
a phase detector to receive a first phase feedback signal of the first converter and a second phase feedback signal of the second converter, to measure the phase difference between the first phase feedback signal and the second phase feedback signal and to produce a phase detection output indicating the measurement;
a phase controller coupled to the phase detector to receive the phase detection output and to generate a phase adjustment output in response to the phase detection output;
a phase compensator to receive a first duty cycle measurement of the first converter and a second duty cycle measurement of the second converter, to compare the first duty cycle measurement to the second duty cycle measurement and to generate a phase compensation in response to the comparison;
a phase combiner to combine the phase adjustment output and the phase compensation to produce a phase control output;
a differential ON time generation circuit coupled to the phase combiner to generate a first ON time for the first converter and a second ON time for the second converter and to adjust the second ON time based on the phase control output; and
a cycle controller coupled to the first and the second converters and to the differential ON time generation circuit to receive the first and the second ON time and to generate a first drive signal to control switching of the first converter and to generate a second drive signal to control switching of the second converter in response to the first and the second ON time;
wherein the comparison comprises a ratio of a difference between the first duty cycle measurement and the second duty cycle measurement and a sum of the first duty cycle measurement and the second duty cycle measurement.

16. The boost converter control system of claim 15, wherein the first converter has a first power phase with a first primary stroke during which a first gate of the first converter is enabled and wherein the first duty cycle measurement comprises a comparison of a duration of the first primary stroke and a duration of the first power phase,
wherein the second converter has a second power phase with a second primary stroke during which a second gate of the second converter is enabled and the second duty cycle measurement comprises a comparison of a duration of the second primary stroke and a duration of the second power phase.

17. The interleaved boost converter of claim 15, wherein the phase control output is to drive the phase of the second converter to 180 degrees with respect to the first converter.

18. A method comprising:
receiving a first duty cycle measurement of a first converter of an interleaved boost converter;
receiving a second duty cycle measurement of a second converter of the interleaved boost converter;
comparing the first duty cycle measurement to the second duty cycle measurement;
generating a phase compensation in response to the comparison;
combining a phase adjustment output and the phase compensation to produce a phase control output;
generating a first drive signal to control switching of the first converter;
adjusting a time of a second drive signal using the phase control output; and
generating the second drive signal to control switching of the second converter;
wherein the comparing comprises calculating a ratio of a difference between the first duty cycle measurement and the second duty cycle measurement and a sum of the first duty cycle measurement and the second duty cycle measurement.

19. The method of claim 18, further comprising
measuring the first duty cycle during a same switching cycle of the interleaved boost converter; and
measuring the second duty cycle during the same switching cycle of the interleaved boost converter.

20. The method of claim 18, wherein the phase control output is to drive the phase of the second converter to 180 degrees with respect to the first converter.

* * * * *